US012581764B2

(12) United States Patent
Yang et al.

(10) Patent No.: US 12,581,764 B2
(45) Date of Patent: Mar. 17, 2026

(54) BOND STRUCTURE HAVING SHIELDING STRUCTURES FOR STACKED IC CHIPS

(71) Applicant: Taiwan Semiconductor Manufacturing Company, Ltd., Hsinchu (TW)

(72) Inventors: Hao-Lin Yang, Kaohsiung City (TW); Kuan-Chieh Huang, Hsinchu City (TW); Wei-Cheng Hsu, Kaohsiung City (TW); Tzu-Jui Wang, Fengshan City (TW); Chen-Jong Wang, Hsin-Chu (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 295 days.

(21) Appl. No.: 18/302,900

(22) Filed: Apr. 19, 2023

(65) Prior Publication Data
US 2024/0355859 A1 Oct. 24, 2024

(51) Int. Cl.
H10F 39/00 (2025.01)
H10F 39/18 (2025.01)

(52) U.S. Cl.
CPC ......... H10F 39/811 (2025.01); H10F 39/014 (2025.01); H10F 39/024 (2025.01); (Continued)

(58) Field of Classification Search
None
See application file for complete search history.

(56) References Cited

U.S. PATENT DOCUMENTS

| | | | | |
|---|---|---|---|---|
| 2011/0241152 A1* | 10/2011 | Hsiao | .................... | H10F 39/014 |
| | | | | 438/73 |
| 2013/0327921 A1* | 12/2013 | Chen | .................... | H10F 39/199 |
| | | | | 257/E31.127 |

(Continued)

FOREIGN PATENT DOCUMENTS

| | | |
|---|---|---|
| TW | 201403833 A | 1/2014 |

OTHER PUBLICATIONS

U.S. Appl. No. 18/301,450, filed Apr. 17, 2023.
Non-Final Office Action dated Feb. 4, 2026 for U.S. Appl. No. 18/301,450.

*Primary Examiner* — Bilkis Jahan
(74) *Attorney, Agent, or Firm* — Eschweiler & Potashnik, LLC

(57) ABSTRACT

Various embodiments of the present disclosure are directed towards an integrated circuit (IC) including a first IC chip bonded to a second IC chip. The first IC chip includes a plurality of photodetectors disposed in a first substrate and a first bond structure. The first bond structure includes a first plurality of bond contacts disposed on a first plurality of conductive bond pads. The second IC chip includes a second bond structure and a second substrate. A first bond interface is disposed between the first bond structure and the second bond structure. The second bond structure comprises a second plurality of bond contacts. The first bond structure further includes a first plurality of shield structures disposed between adjacent conductive bond pads in the first plurality of conductive bond pads.

20 Claims, 24 Drawing Sheets

100a

(52) U.S. Cl.
CPC ......... *H10F 39/18* (2025.01); *H10F 39/8037*
(2025.01); *H10F 39/804* (2025.01); *H10F*
*39/8057* (2025.01)

(56)                        References Cited

U.S. PATENT DOCUMENTS

| 2015/0061062 | A1* | 3/2015 | Lin ..................... H10F 39/8057 |
| | | | 438/69 |
| 2017/0236724 | A1* | 8/2017 | Chang ..................... H01L 24/14 |
| | | | 438/15 |
| 2019/0006264 | A1* | 1/2019 | Vaidya ................... H01L 24/06 |
| 2020/0135795 | A1 | 4/2020 | Madurawe et al. |
| 2021/0288029 | A1 | 9/2021 | Huang et al. |
| 2022/0077215 | A1 | 3/2022 | Horikoshi |
| 2022/0199670 | A1 | 6/2022 | Jang et al. |
| 2022/0270973 | A1 | 8/2022 | Verma et al. |
| 2023/0081238 | A1 | 3/2023 | Jang et al. |
| 2024/0006537 | A1 | 1/2024 | Yang et al. |

* cited by examiner

100a

100b

800a

800b

800c

800d

900

101f 124
101

124

101b

1000

101f    614        614

124
101

124

101b

1100

1200

1400b

1500

1800

2100

2200

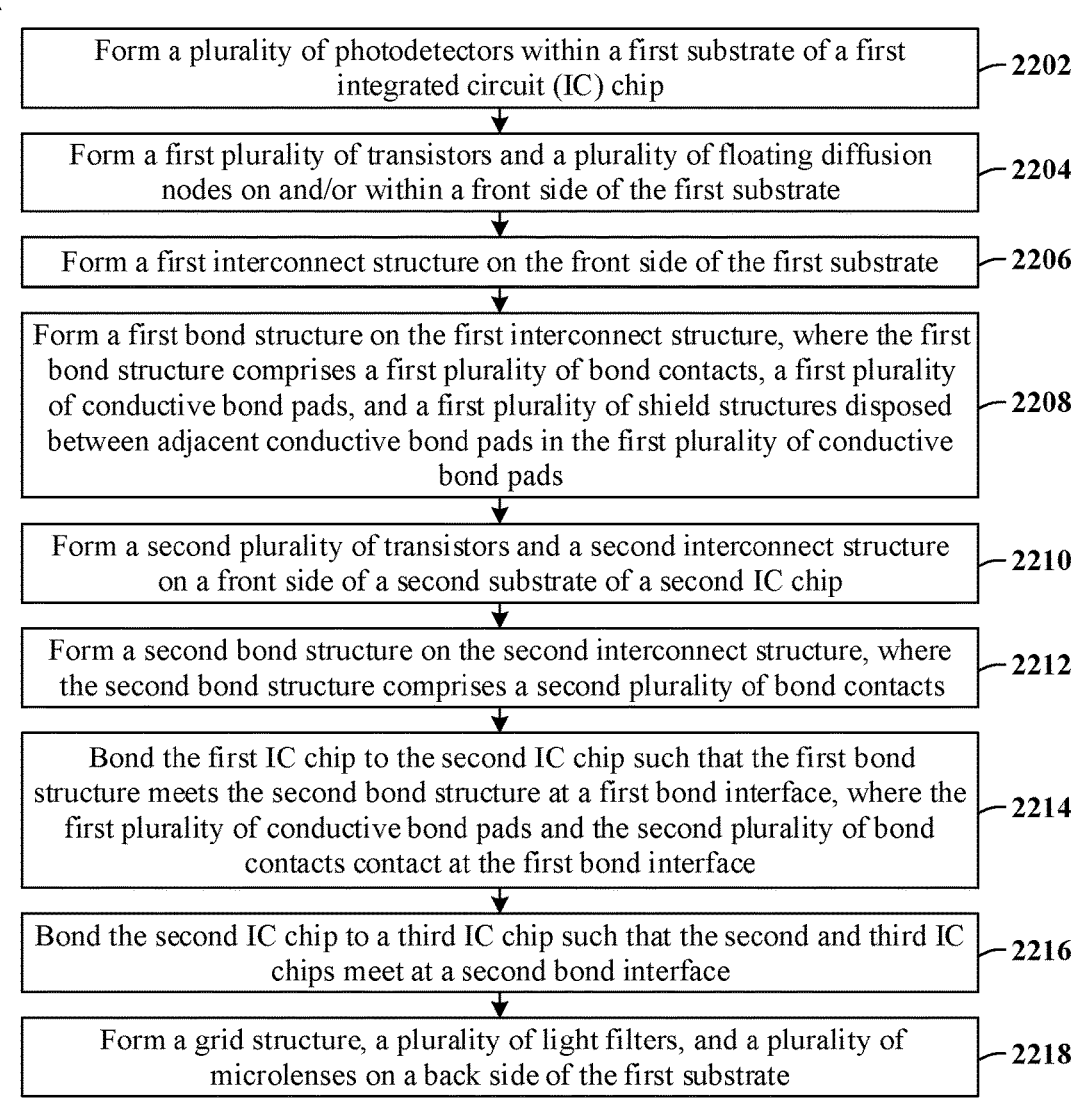

| | |
|---|---|
| Form a plurality of photodetectors within a first substrate of a first integrated circuit (IC) chip | 2202 |
| Form a first plurality of transistors and a plurality of floating diffusion nodes on and/or within a front side of the first substrate | 2204 |
| Form a first interconnect structure on the front side of the first substrate | 2206 |
| Form a first bond structure on the first interconnect structure, where the first bond structure comprises a first plurality of bond contacts, a first plurality of conductive bond pads, and a first plurality of shield structures disposed between adjacent conductive bond pads in the first plurality of conductive bond pads | 2208 |
| Form a second plurality of transistors and a second interconnect structure on a front side of a second substrate of a second IC chip | 2210 |
| Form a second bond structure on the second interconnect structure, where the second bond structure comprises a second plurality of bond contacts | 2212 |
| Bond the first IC chip to the second IC chip such that the first bond structure meets the second bond structure at a first bond interface, where the first plurality of conductive bond pads and the second plurality of bond contacts contact at the first bond interface | 2214 |
| Bond the second IC chip to a third IC chip such that the second and third IC chips meet at a second bond interface | 2216 |
| Form a grid structure, a plurality of light filters, and a plurality of microlenses on a back side of the first substrate | 2218 |

Fig. 22

BOND STRUCTURE HAVING SHIELDING STRUCTURES FOR STACKED IC CHIPS

BACKGROUND

Many modern-day electronic devices (e.g., smartphones, digital cameras, biomedical imaging devices, automotive imaging devices, etc.) comprise image sensors. The image sensors comprise one or more photodetectors (e.g., photodiodes, phototransistors, photoresistors, etc.) configured to absorb incident radiation and output electrical signals corresponding to the incident radiation. Image sensors may comprise stacked chips to decrease a footprint of each pixel and increase device density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 22 illustrates a flowchart according to some embodiments of a method for forming a stacked IC device including a bond structure having shield structures.

DETAILED DESCRIPTION

Figure 1A:
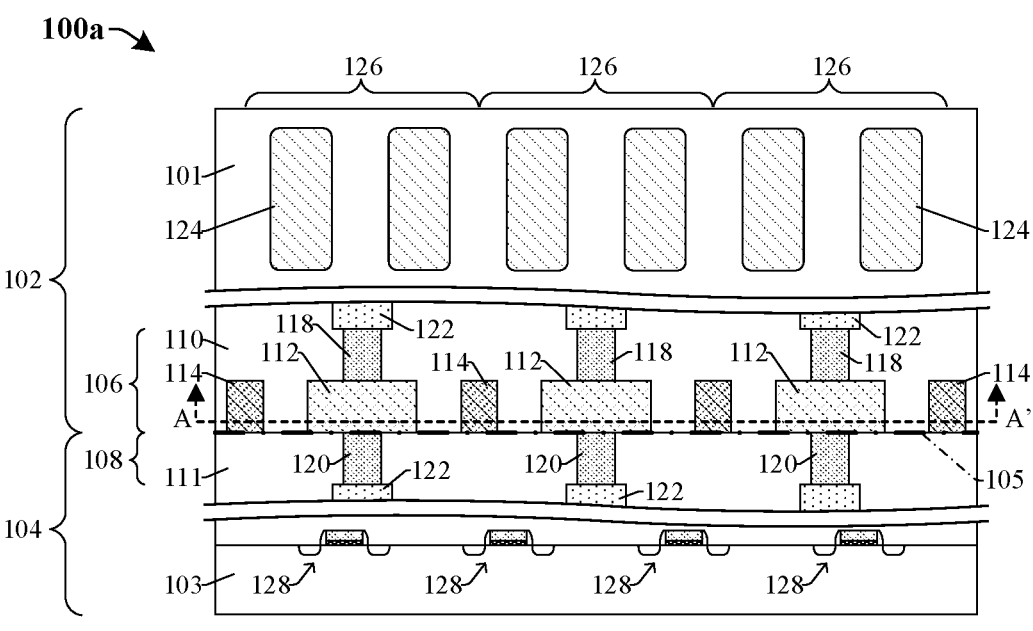
FIGS. 1A and 1B illustrate various views of some embodiments of a stacked integrated circuit (IC) device comprising a bond structure having shield structures.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked complementary metal-oxide semiconductor (CMOS) image sensor may comprise a first integrated circuit (IC) chip and a second IC chip that are stacked. The first IC chip comprises a plurality of pixels arrange in a plurality of rows and a plurality of columns. The pixels comprise photodetectors and floating diffusion nodes disposed within a first substrate of the first IC chip. Further, transfer transistors are disposed on the first substrate and are each configured to transfer accumulated charge from the photodetectors to a corresponding floating diffusion node. The first IC chip further comprises a first bond structure including a first plurality of bond contacts disposed on a first plurality of conductive bond pads. The second IC chip comprises a second bond structure including a second plurality of bond contacts disposed on a second plurality of conductive bond pads. The first plurality of conductive bond pads contact the second plurality of conductive bond pads at a bond interface. Further, the first plurality of conductive bond pads are respectively electrically coupled to an individual pixel in the plurality of pixels.

In an example, a plurality of readout transistors individual to the pixels is disposed on the first substrate. The readout transistors comprise source-follower transistors, reset transistors, and select transistors which are configured to conduct readout of the photodetectors such that charge accumulated by the photodetectors from incident radiation may be readout as a corresponding electrical signal at an output of the readout transistors (e.g., at a source/drain terminal of the select transistor). An application specific integrated circuit (ASIC) is disposed on the second IC chip and comprises a plurality of semiconductor devices (e.g., transistors) configured to receive the electrical signal from the readout transistors and perform image signal processing. The plurality of semiconductor devices are electrically coupled to the first IC chip by way of the conductive bond pads.

During operation of the stacked CMOS image sensor, the conductive bond pads of the first bond structure transfer electrical signals from the select transistors that correspond to magnitudes of charge accumulated by the photodetectors of each pixel on a column-by-column basis. For instance, photodetectors of a first pixel coupled to a first conductive bond pad in a first column is read, then photodetectors of a second pixel coupled to a second conductive bond pad in a second column is read, and so on. As a result of a close proximity of the conductive bond pads in the first plurality of conductive bond pads, there may be parasitic capacitance and/or parasitic inductance between adjacent conductive bond pads. The parasitic capacitance and/or parasitic inductance causes crosstalk between the adjacent conductive bond pads. The crosstalk increases as features of the stacked CMOS image sensor are scaled down. This, in part, decreases an overall performance of the stacked CMOS image sensor and degrades the accuracy of an image produced by the stacked CMOS image sensor.

In another example, in an effort to facilitate scaling of the pixels without reducing a size of the photodetectors, the plurality of readout transistors may be disposed on a second substrate of the second IC chip. In such an embodiment, floating diffusion node(s) of each pixel are directly electrically coupled to an individual conductive bond pad in the first plurality of conductive bond pads. The first plurality of conductive pads are configured to transfer accumulated charge from the photodetectors (e.g., by way of the floating diffusion node(s)) to gates of the plurality of source-follower transistors. However, the pixels are readout on a column-by-column basis and the conductive bond pads in the first plurality of conductive bond pads have a close proximity, such that crosstalk may occur between the adjacent conductive bond pads. As a result, an overall performance of the image sensor is decreased.

Further, both the first and second bond structures each comprise two or more conductive bonding layers. For example, the second bond structure has a first conductive bonding layer comprising the second plurality of bond contacts and a second conductive bonding layer comprising the second plurality of conductive bond pads. Having the two or more conductive bonding layers in the first and second bond structures may increase resistivity between the first IC chip and the second IC chip and/or may increase fabrication costs of the image sensor.

Accordingly, various embodiments of the present application are directed towards a stacked IC device having bond structures configured to reduce signal interference between adjacent conductive bond pads. The stacked IC device comprises a first IC chip stacked with a second IC chip. A plurality of pixels is disposed on the first IC chip and comprises a plurality of photodetectors disposed in a first substrate of the first IC chip. A first bond structure is disposed on the first substrate and comprises a first plurality of bond contacts disposed on a plurality of conductive bond pads. The conductive bond pads are coupled to components and/or structures of the pixels. The plurality of conductive bond pads is bonded to a second bond structure of the second IC chip, where the second bond structure comprises a single layer of conductive bond features. For example, the single layer of conductive bond features may be a second plurality of bond contacts. Further, the first bond structure comprises a plurality of shield structures.

The shield structures are disposed between adjacent conductive bond pads in the first bond structure. The shield structures block and/or obstruct electromagnetic fields between the adjacent conductive bond pads, thereby reducing parasitic capacitance and inductance between conductive bond pads of the first bond structure. As a result, crosstalk between adjacent conductive bond pads is reduced. Accordingly, device features of the stacked IC device may be scaled while increasing an overall performance of the stacked IC device (e.g., increasing accuracy of an image produced by the stacked IC device). Further, by virtue of the second bond structure comprising the single layer of conductive bond features, a number of conductive structures in the stacked IC device is reduced thereby decreasing resistivity between the first and second IC chips and decreasing fabrication costs of the stacked IC device.

Figure 1B:
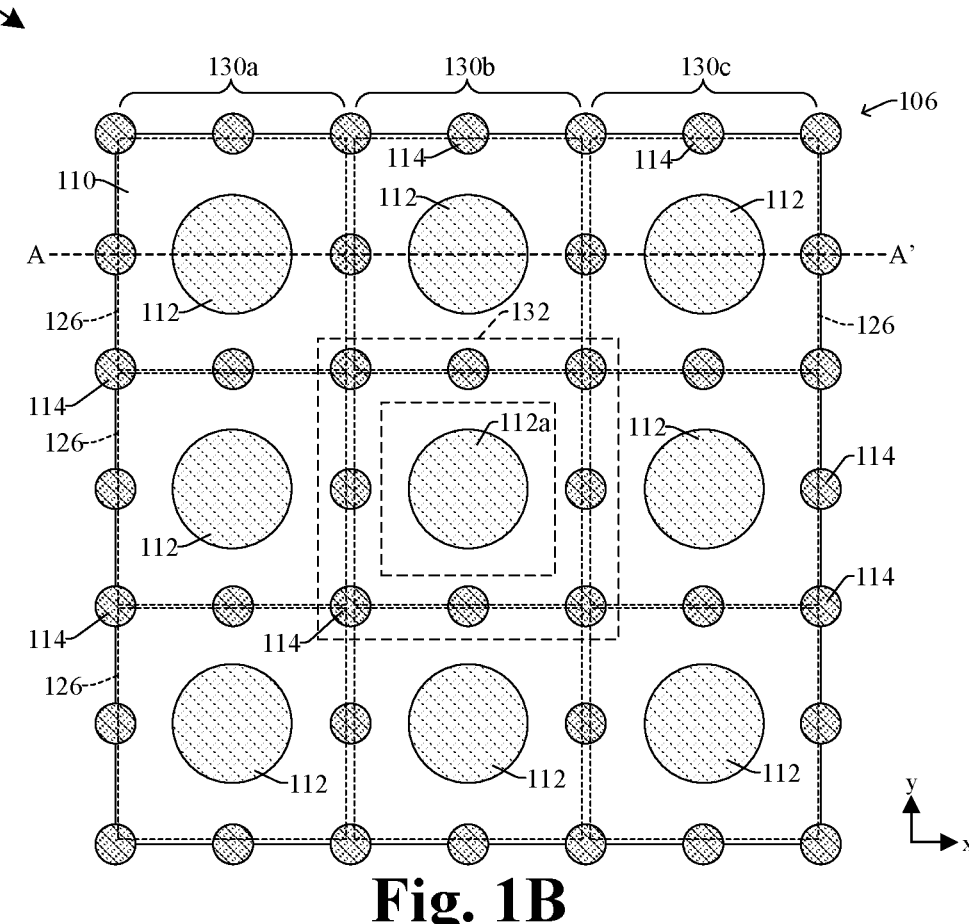

FIGS. 1A and 1B illustrate various views 100a and 100b of some embodiments of a stacked IC device including a bond structure having shield structures. FIG. 1A illustrates a cross-sectional view 100a of some embodiments of the stacked IC device taken along line A-A' in FIG. 1B. FIG. 1B illustrates a top view 100b of some embodiments of the stacked IC device taken along line A-A' in FIG. 1A.

The stacked IC device includes a first IC chip 102 having a first bond structure 106 and a second IC chip 104 having a second bond structure 108. The first and second bond structures 106, 108 meet at a first bond interface 105. The first IC chip 102 further includes a first substrate 101 and a plurality of pixels 126 that each comprise a plurality of photodetectors 124 disposed within the first substrate 101. The first bond structure 106 is disposed between the first substrate 101 and the second IC chip 104. The first bond structure 106 comprises a first plurality of conductive bond pads 112 and a first plurality of bond contacts 118 disposed within a first dielectric structure 110. The conductive bond pads 112 of the first bond structure 106 are electrically coupled to a plurality of wires 122 of the first IC chip 102 by way of the first plurality of bond contacts 118. In some embodiments, the first plurality of conductive bond pads 112 are electrically coupled to the pixels 126 (e.g., by way of a first interconnect structure (not shown) disposed on the first substrate 101).

The second IC chip 104 comprises a second substrate 103 and a plurality of semiconductor devices 128 disposed on the second substrate 103. The plurality of semiconductor devices 128 may, for example, be or comprise readout transistors (e.g., comprising source-follower transistor(s), select transistor(s), reset transistor(s), etc.), logic devices, other suitable semiconductor devices, or the like. The second bond structure 108 overlies the second substrate 103 and is electrically coupled to the semiconductor devices 128 (e.g., by way of a second interconnect structure (not shown) disposed on the second substrate 103).

The second bond structure 108 comprises a second plurality of bond contacts 120 disposed within a second dielectric structure 111. The second plurality of bond contacts 120 of the second bond structure 108 are electrically coupled to a plurality of wires 122 of the second IC chip 104. The first plurality of conductive bond pads 112 and the second plurality of bond contacts 120 are bonded to one another at the first bond interface 105. As such, the first plurality of conductive bond pads 112 and the second plurality of bond contacts 120 facilitate electrical coupling between the first and second IC chips 102, 104. Further, the first and second dielectric structures 110, 111 are bonded to one another at the first bond interface 105. Accordingly, the first bond interface 105 comprises dielectric-to-dielectric bond interface(s) and conductor-to-conductive bond interface(s).

The first bond structure 106 further comprises a first plurality of shield structures 114 disposed within the first dielectric structure 110 and between adjacent conductive bond pads in the first plurality of conductive bond pads 112. In some embodiments, the first plurality of shield structures 114 are electrically coupled to ground (e.g., electrically coupled to 0 volts). In further embodiments, the first plurality of shield structures 114 are electrically coupled to a voltage source (not shown) configured to apply a voltage to the shield structures 114. In various embodiments, the first plurality of shield structures 114 are electrically floating.

As illustrated in the top view 100b of FIG. 1B, the plurality of pixels 126 are disposed in an array comprising a plurality of rows and a plurality of columns 130a-c. The plurality of columns 130a-c comprises a first column 130a of pixels, a second column 130b of pixels, and a third column 130c of pixels. During operation of the stacked IC device, electrical signals (e.g., voltages, currents, etc.) are transmitted from the first IC chip 102 to the second IC chip 104 by way of the first plurality of conductive bond pads 112 and the second plurality of bond contacts 120 (e.g., from the photodetectors 124 to the semiconductor devices (128 of FIG. 1A)). For example, readout operations on the plurality of pixels 126 may be completed column-by-column such that electrical signals from pixels within the first column 130a may be read first, electrical signals from pixels within the second column 130b may be read second, and so on. The first plurality of conductive bond pads 112 are configured to transfer the electrical signals from each pixel within a corresponding column 130a-c during the readout operations. While a readout operation is performed on pixels in an individual column, pixels in adjacent columns may be set to a high voltage. For instances, during readout of the pixels in the first column 130a the pixels within the second and third columns 130b-c are set to the high voltage.

By virtue of adjacent conductive bond pads in the first plurality of conductive bond pads 112 being laterally separated from one another by one or more shield structures 114, parasitic capacitance and inductance between the adjacent conductive bond pads is reduced. For instance, as seen in FIG. 1B, the first plurality of conductive bond pads 112 comprises a first conductive bond pad 112a surrounded by a first subset of shield structures 132 that is part of the first plurality of shield structures 114. The first subset of shield structures 132 is disposed around an outer perimeter of the first conductive bond pad 112a and separates the first conductive bond pad 112a from other conductive bond pads in the first plurality of conductive bond pads 112. The shield structures 114 in the first subset of shield structures 132 block and/or obstruct electromagnetic fields between the first conductive bond pad 112a and the other adjacent conductive bond pads. For example, the first plurality of shield structures 114 may be electrically coupled to ground, electrically coupled to a voltage source, or electrically floating during readout of the pixels 126, thereby reducing parasitic capacitance between conductive bond pads 112 in adjacent columns. In another example, the first plurality of shield structures 114 may comprise a dielectric material and are configured to reduce an effective dielectric constant between adjacent conductive bond pads in the first plurality of conductive bond pads 112, thereby reducing parasitic capacitance between conductive bond pads 112 in adjacent columns. As a result, electrical signals transferred through the first conductive bond pad 112a have a reduced effect on the other adjacent conductive bond pads in the first plurality of conductive bond pads 112. Accordingly, issues due to a proximity between adjacent conductive bond pads in the first plurality of conductive bond pads 112 are reduced (e.g., issues related to crosstalk are reduced), thereby decreasing signal interference between the first and second IC chips 102, 104. As a result, an overall performance of the stacked IC device is increased (e.g., the accuracy of an output from the stacked IC device is increased). For example, by virtue of the first bond structure 106 comprising the shield structures 114 surrounding an outer perimeter of each conductive bond pad 112, a quality of an image produced by the pixels 126 is increased.

In addition, as illustrated in the cross-sectional view 100a of FIG. 1A, the second bond structure 108 comprises a single layer of conductive features (e.g., the second plurality of bond contacts 120). As a result, a layout of the first bond structure 106 is asymmetrical with a layout of the second bond structure 108. Further, the second bond structure 108 comprising the single layer of conductive features decreases a number of conductive structures in the stacked IC, thereby reducing a resistivity and RC delay between the first IC chip 102 and the second IC chip 104. Further, having less conductive structures in the stacked IC device facilitates reducing sizes and/or spacing between conductive structures in the stacked IC device, thereby facilitating device scaling.

In some embodiments, the shield structures 114 comprise a dielectric material such as silicon dioxide, a low-k dielectric material, some other dielectric material, or any combination of the foregoing. As used herein, a low-k dielectric material is a dielectric with a dielectric constant less than about 3.9. The first plurality of shield structures 114 comprising the dielectric material decreases an effective dielectric constant between adjacent conductive bond pads in the first plurality of conductive bond pads 112, thereby decreasing parasitic capacitance in the first IC chip 102. In some embodiments, a dielectric constant of the first plurality of shield structures 114 is less than a dielectric constant of the first dielectric structure 110. In yet further embodiments, the shield structures 114 comprise a conductive material such as copper, aluminum, tungsten, silver, gold, some other conductive material, or any combination of the foregoing. In some embodiments, the first plurality of shield structures 114 comprising the conductive material facilitates the shield structures 114 being grounded and/or biased, thereby increasing an ability for the shield structures 114 to block and/or obstruct electromagnetic fields between adjacent conductive bond pads in the first plurality of conductive bond pads 112. In yet further embodiments, heights of the shield structures 114 are equal to heights of the conductive bond pads 112.

The first plurality of conductive bond pads 112 may, for example, be or comprise copper, aluminum, tungsten, silver, gold, some other conductive material, or any combination of the foregoing. In various embodiments, a size or an area of each shield structure 114 is within a range of about 10% to 80% of a size or an area of an individual conductive bond pad in the first plurality of conductive bond pads 112. For example, as seen in the top view of FIG. 1B, a diameter of each shield structure 114 is within a range of about 10% to 80% of a diameter of an individual conductive bond pad in the first plurality of conductive bond pads 112. This facilitates forming the shield structures 114 around each conductive bond pad without reducing sizes of the first plurality of conductive bond pads 112.

The first plurality of bond contacts 118 and the second plurality of bond contacts 120 may, for example, be or comprise copper, aluminum, tungsten, titanium nitride, tantalum nitride, some other conductive material, or any combination of the foregoing. In some embodiments, the first plurality of conductive bond pads 112 and the first plurality of shield structures 114 comprise a same conductive material (e.g., copper, aluminum, tungsten, silver gold, etc.) In further embodiments, the first plurality of conductive bond pads 112 comprise a first material (e.g., copper, aluminum, tungsten, silver gold, etc.) and the first plurality of shield structures 114 comprise a second material (silicon dioxide, a low-k dielectric material, etc.) different from the first material.

Figure 2A:
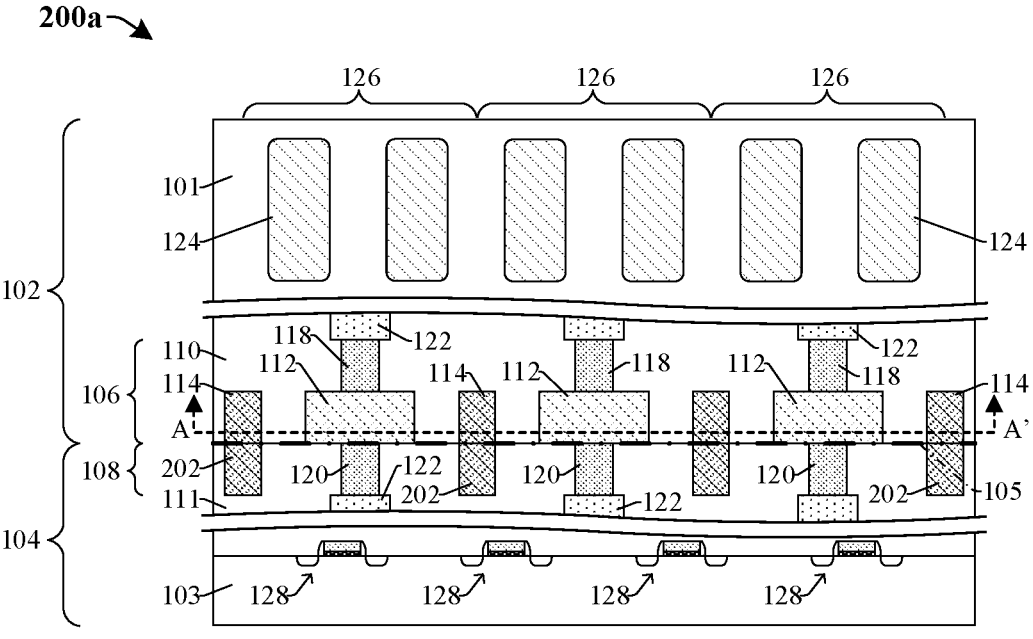
FIGS. 2A and 2B illustrate various cross-sectional views of some other embodiments of the stacked IC device of FIGS. 1A and 1B.

FIG. 2A illustrates a cross-sectional view 200a of some other embodiments of the stacked IC device of FIGS. 1A and 1B, where the second bond structure 108 comprises a second plurality of shield structures 202 disposed within the second dielectric structure 111.

The second plurality of shield structures 202 are disposed between adjacent bond contacts in the second plurality of bond contacts 120. Further, the second plurality of shield structures 202 and the first plurality of shield structures 114 may comprise a same material and have a same layout. For example, the second plurality of shield structures 202 may have a same layout as the first plurality of shield structures 114 when viewed in top view (as illustrated and/or described in FIG. 1B). The second plurality of shield structures 202 are bonded to the first plurality of shield structures 114. Due to a layout of the second plurality of shield structures 202 being symmetrical with a layout of the first plurality of shield structure 114, gas between the first and second IC chips 102, 104 during a bonding process may be more easily discharged, thereby reducing bubbling along the first bond interface 105. As a result, bonding adhesion between the first and second IC chips 102, 104 is increased.

Further, the second plurality of shield structures 202 reduces signal interference (e.g., due to parasitic capacitance and/or inductance) between adjacent bond contacts in the second plurality of bond contacts 120. As a result, crosstalk between bond contacts in the second plurality of bond contacts 120 is reduced. In some embodiments, the second plurality of shield structures 202 comprise a dielectric material such as silicon dioxide, a low-k dielectric material, some other dielectric material, or any combination of the foregoing. In yet further embodiments, the second plurality of shield structures 202 comprise a conductive material such as copper, aluminum, tungsten, silver, gold, some other conductive material, or any combination of the foregoing.

Figure 2B:
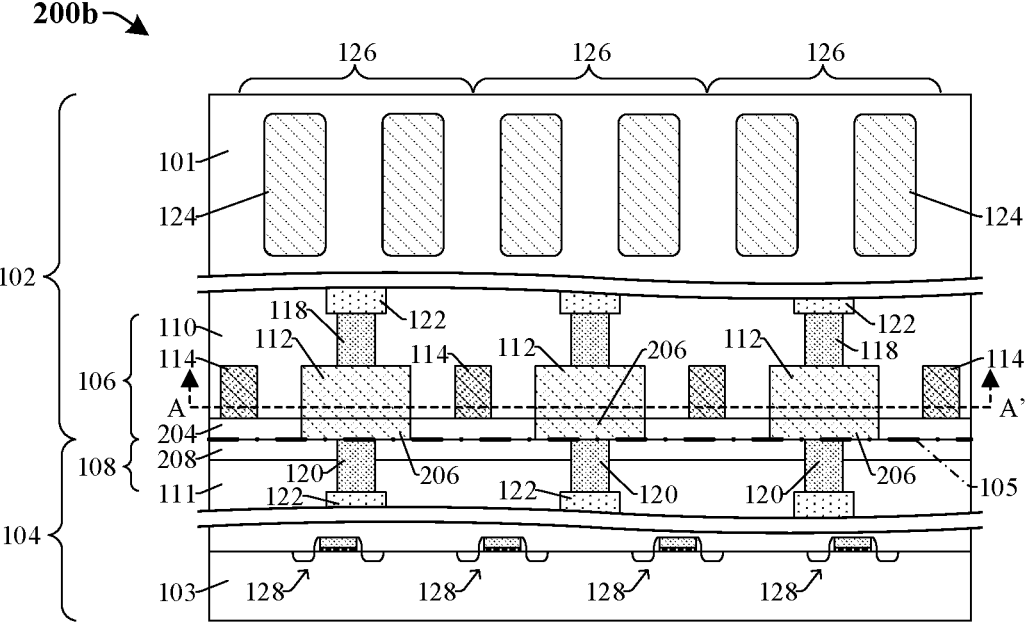

FIG. 2B illustrates a cross-sectional view 200b of some other embodiments of the stacked IC device of FIGS. 1A and 1B, where the first bond structure 106 further comprises a second plurality of conductive bond pads 206 disposed within a first dielectric layer 204.

In some embodiments, the second plurality of conductive bond pads 206 are bonded to the second plurality of bond contacts 120 at the first bond interface 105. The second bond structure 106 further comprises a second dielectric layer 208 disposed around the second plurality of bond contacts 120. The first dielectric layer 204 is bonded to the second dielectric layer 208 at the first bond interface 105. In some embodiments, the first and second dielectric layers 204, 208 may, for example, be or comprise silicon oxide, silicon oxynitride, silicon nitride, some other dielectric material, or the like. Further, the first dielectric layer 204 is disposed between the first plurality of shield structures 114 and the first bond interface 105. By virtue of the first dielectric layer 204 being disposed between the first plurality of shield structures 114 and the second dielectric layer 208, the first dielectric layer 204 is bonded directly to the second dielectric layer 208, thereby increasing bonding adhesion along the first bond interface 105. In various embodiments, a thickness of the second plurality of conductive bond pads 206 is less than a thickness of the first plurality of conductive bond pads 112. In further embodiments, the thickness of the second plurality of conductive bond pads 206 is greater than the thickness of the first plurality of conductive bond pads 112 (not shown). The second plurality of conductive bond pads 206 may, for example, be or comprise copper, aluminum, tungsten, silver, gold, some other conductive material, or any combination of the foregoing.

FIGS. 3A-3E illustrate various top views 300a-e of some other embodiments of the stacked IC device of FIG. 1A, 2A, or 2B. FIGS. 3A-3E illustrate the top views 300a-e of some embodiments of the stacked IC device taken along line A-A' in FIG. 1A, 2A, or 2B.

Figure 3A:
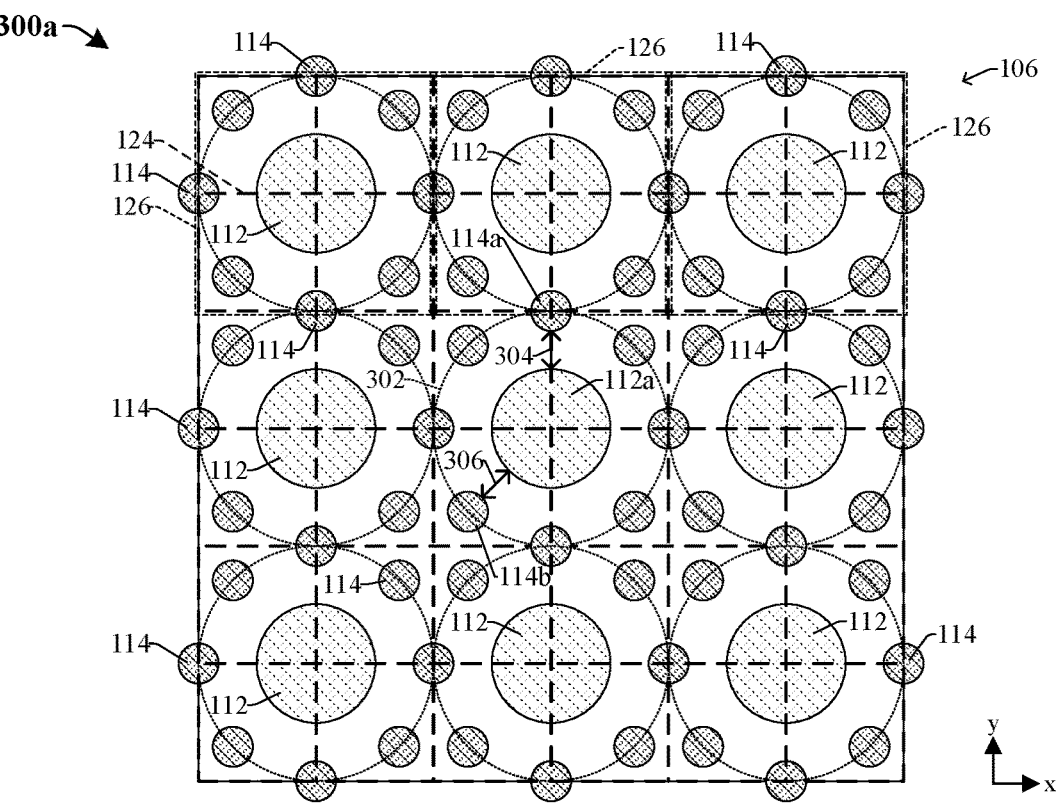
FIGS. 3A-3E illustrate various top view views of some other embodiments of the stacked IC device of FIGS. 1A and 1B.

As illustrated in the top view 300a of FIG. 3A, a subset of shield structures in the first plurality of shield structures 114 is disposed around an outer perimeter of each conductive bond pad in the first plurality of conductive bond pads 112. The subset of shield structures in the first plurality of shield structures 114 is disposed along a circular path that is concentric with a center of the corresponding bond pad. For example, the shield structures 114 surrounding the first conductive bond pad 112a are disposed along a first circular path 302 that is concentric with a center of the first conductive bond pad 112a. In some embodiments, centers of the shield structures 114 surrounding the first conductive bond pad 112a are disposed at different points along the first circular path 302. Accordingly, distances between the shield structures 114 surrounding the first conductive bond pad 112a and an outer perimeter of the first conductive bond pad 112a are equal. For example, a first distance 304 between a first shield structure 114a and the outer perimeter of the first conductive bond pad 112a is equal to a second distance 306 between a second shield structure 114b and the outer perimeter of the first conductive bond pad 112a.

Figure 3B:
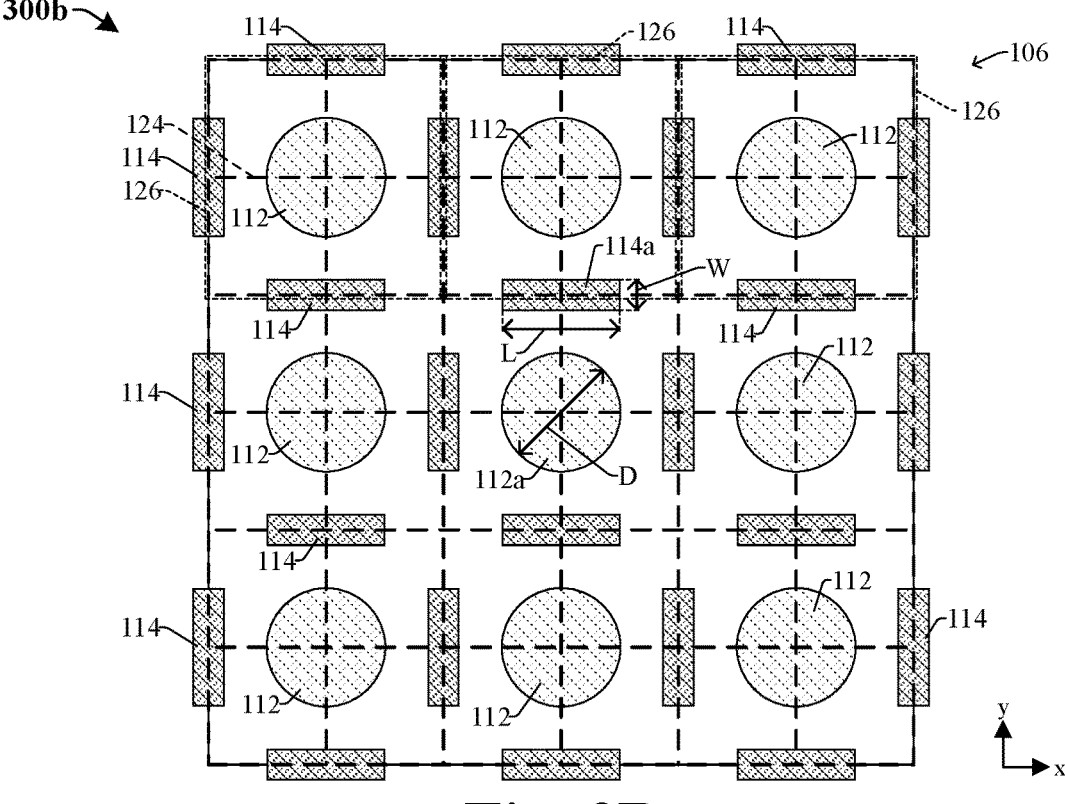

As illustrated in the top view 300b of FIG. 3B, the first plurality of shield structures 114 have a first shape and the first plurality of conductive bond pads 112 have a second shape different from the first shape. In some embodiments, the first shape may be rectangular and the second shape may be circular. In further embodiments, widths of the shield structures 114 are within a range of about 10% to about 80% of a length or diameter of the conductive bond pads 112. In some embodiments, lengths of the shield structures 114 are within a range of about 10% to about 200% of a length or diameter of the conductive bond pads 112. For example, a width W of the first shield structure 114a is within a range of about 10% to about 80% of a diameter D of the first conductive bond pad 112a, and a length L of the first shield structure 114a is within a range of about 10% to about 200% of the diameter D of the first conductive bond pad 112a.

Figure 3C:
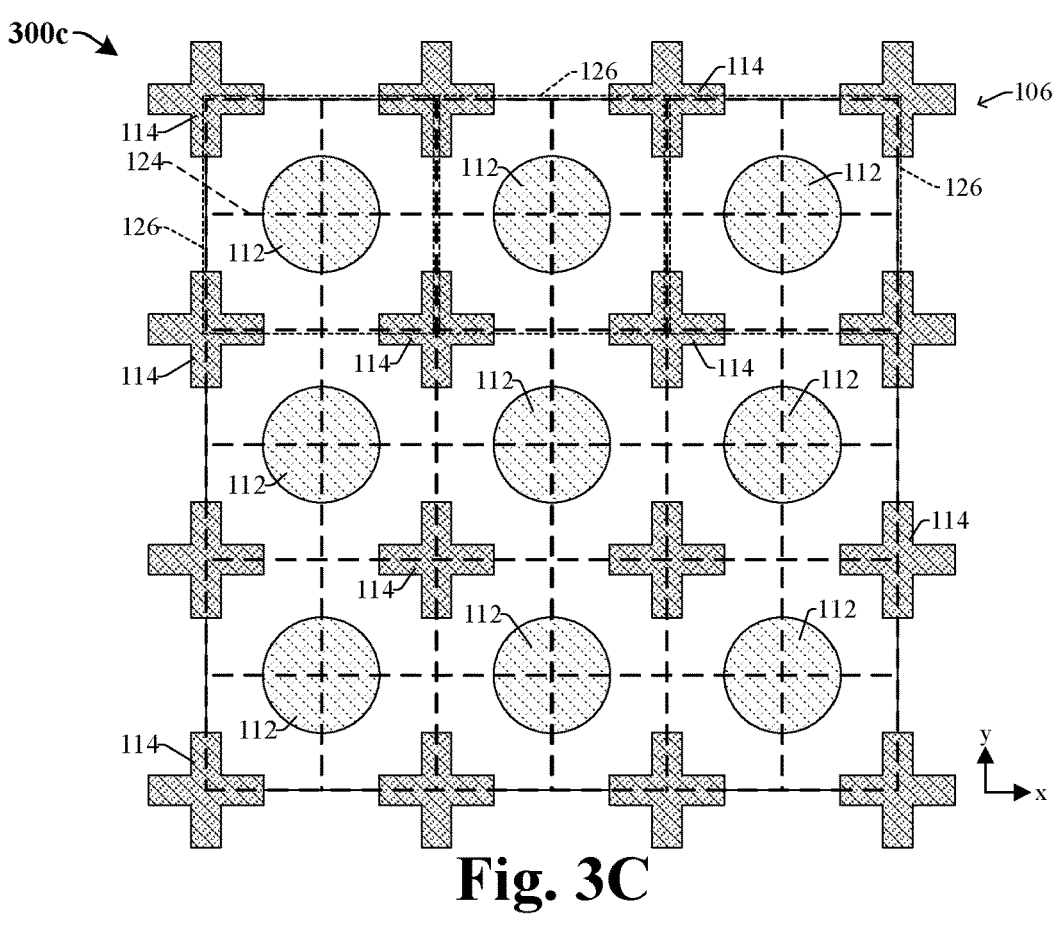

As illustrated in the top view 300c of FIG. 3C, the first plurality of shield structures 114 have a first shape and the first plurality of conductive bond pads 112 have a second shape different from the first shape. In some embodiments, the first shape may be a cross shape and the second shape may be a circular shape.

Figure 3D:
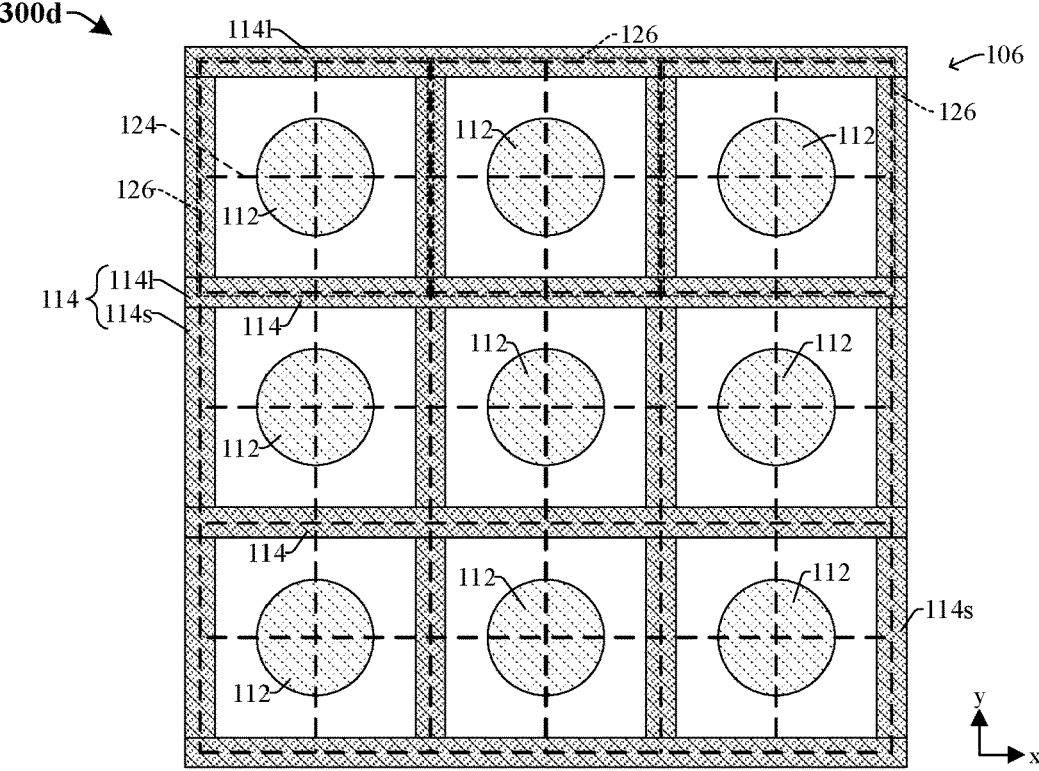

As illustrated in the top view 300d of FIG. 3D, the first plurality of shield structures 114 comprise elongated shield structures 1141 extending continuously in a first direction and shortened shield structures 114s extending continuously in a second direction orthogonal to the first direction. The shortened shield structures 114s continuously extend between adjacent elongated shield structures 1141. In various embodiments, the elongated shield structures 1141 and the shortened shield structures 114s are a single continuous structure such that the first plurality of shield structures 114 has a grid pattern comprising openings, where the first plurality of conductive bond pads 112 are disposed within the openings. Accordingly, in some embodiments, the first plurality of shield structures 114 continuously wraps around an outer perimeter of each conductive bond pad in the first plurality of conductive bond pads 112 in an unbroken path.

Figure 3E:
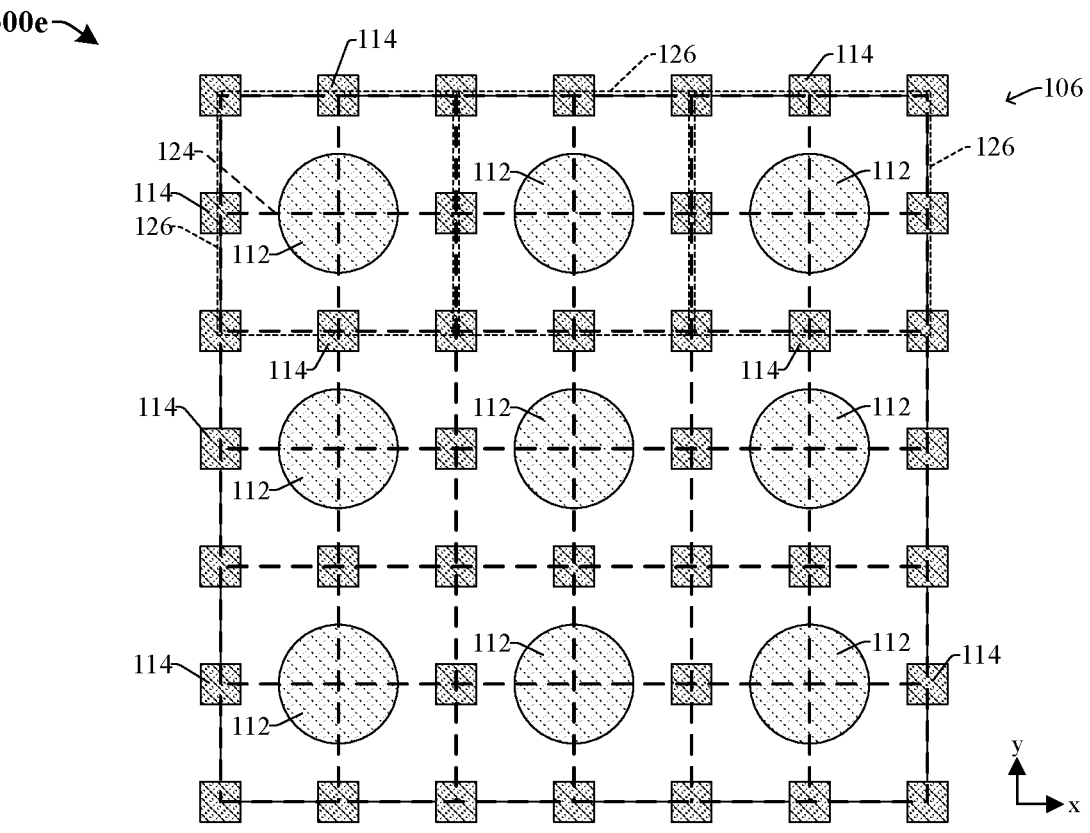

As illustrated in the top view 300e of FIG. 3E, the first plurality of shield structures 114 and the first plurality of conductive bond pads 112 each have a first shape. In some embodiments, the first shape may be a rectangle, a square, a circle, or the like.

Figure 4A:
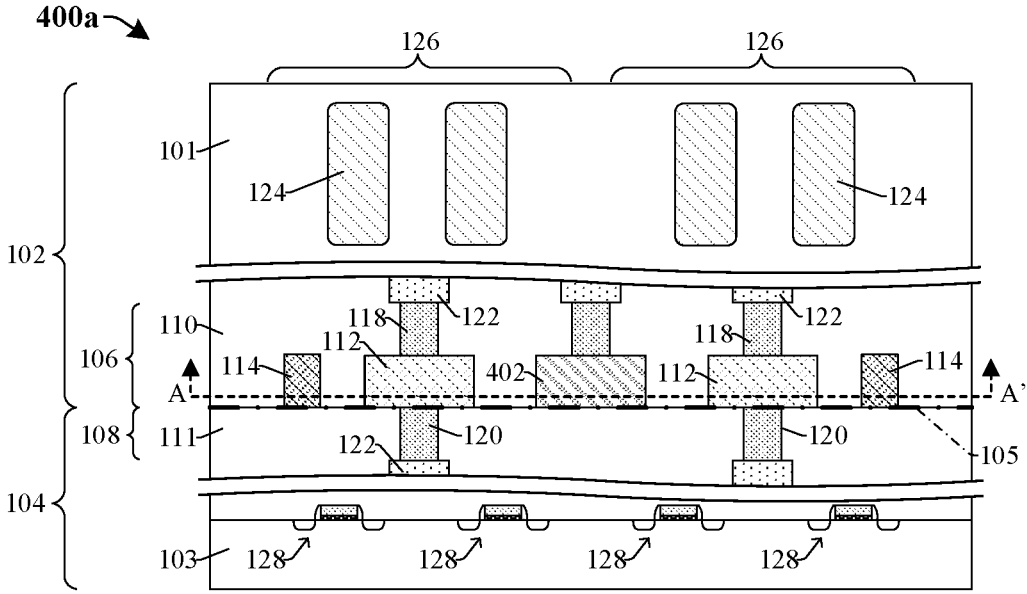
FIGS. 4A-4C illustrate various cross-sectional views of some embodiments of a stacked IC device comprising a bond structure having shield structures and dummy bond pads.

FIG. 4A illustrates a cross-sectional view 400a of some other embodiments of the stacked IC device of FIGS. 1A and 1B, where the first bond structure 106 further comprises a first plurality of dummy bond pads 402 disposed between adjacent conductive bond pads in the first plurality of conductive bond pads 112. It will be appreciated that while FIG. 4A illustrates a single dummy bond pad in the first plurality of dummy bond pads 402, other dummy bond pads (not shown) are disposed in the first dielectric structure 110 out of view (e.g., see FIG. 5).

The first plurality of dummy bond pads 402 are configured to block and/or obstruct electromagnetic fields between the adjacent conductive bond pads in the first plurality of conductive bond pads 112, thereby further reducing crosstalk between the conductive bond pads 112. In some embodiments, the first plurality of dummy bond pads 402 are electrically coupled to ground (e.g., electrically coupled to 0 volts). In further embodiments, the first plurality of dummy bond pads 402 are electrically coupled to a voltage source (not shown) configured to apply a voltage to the first plurality of dummy bond pads 402. In various embodiments, the first plurality of dummy bond pads 402 are electrically floating. In some embodiments, the first plurality of dummy bond pads 402 comprise a dielectric material such as silicon dioxide, a low-k dielectric material, some other dielectric material, or any combination of the foregoing. In yet further embodiments, the first plurality of dummy bond pads 402 comprise a conductive material such as copper, aluminum, tungsten, silver, gold, some other conductive material, or any combination of the foregoing. In some embodiments, the first plurality of dummy bond pads 402 have a same size as the first plurality of conductive bond pads 112.

Figure 4B:
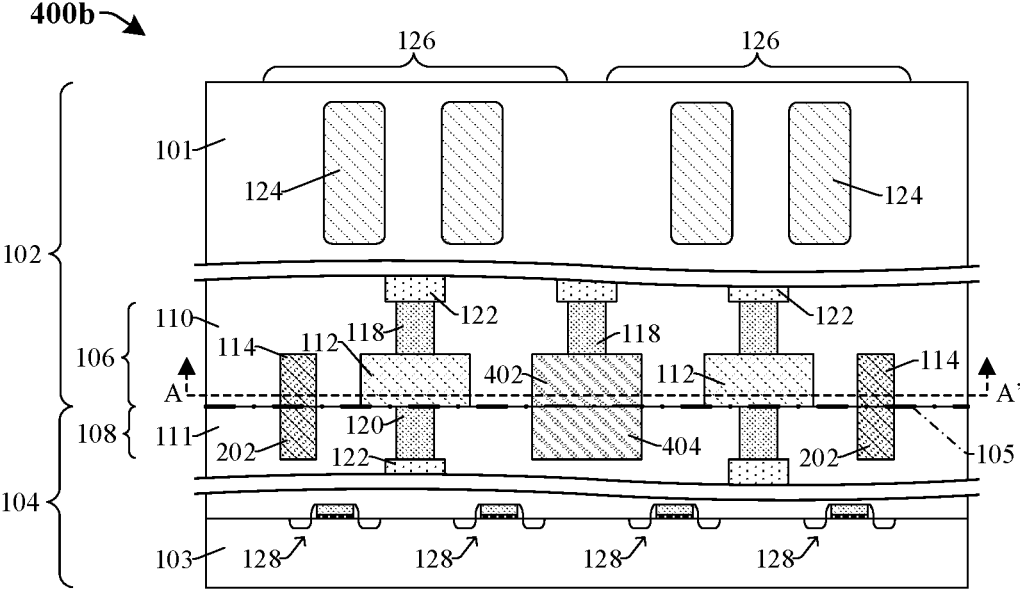

FIG. 4B illustrates a cross-sectional view 400b of some other embodiments of the stacked IC device of FIG. 2A, where the first bond structure 106 further comprises the first plurality of dummy bond pads 402 and the second bond structure 108 comprises a second plurality of dummy bond pads 404. It will be appreciated that while FIG. 4B illustrates a single dummy bond pad in the second plurality of dummy bond pads 404, other dummy bond pads (not shown) are disposed in the second dielectric structure 111 out of view (e.g., directly below the first plurality of dummy bond pads 402 of FIG. 5).

In various embodiments, the second plurality of dummy bond pads 404 are bonded to the first plurality of dummy bond pads 402 at the first bond interface 105. In some embodiments, the second plurality of dummy bond pads 404 comprise a dielectric material such as silicon dioxide, a low-k dielectric material, some other dielectric material, or any combination of the foregoing. In yet further embodiments, the second plurality of dummy bond pads 404 comprise a conductive material such as copper, aluminum, tungsten, silver, gold, some other conductive material, or any combination of the foregoing.

Figure 4C:
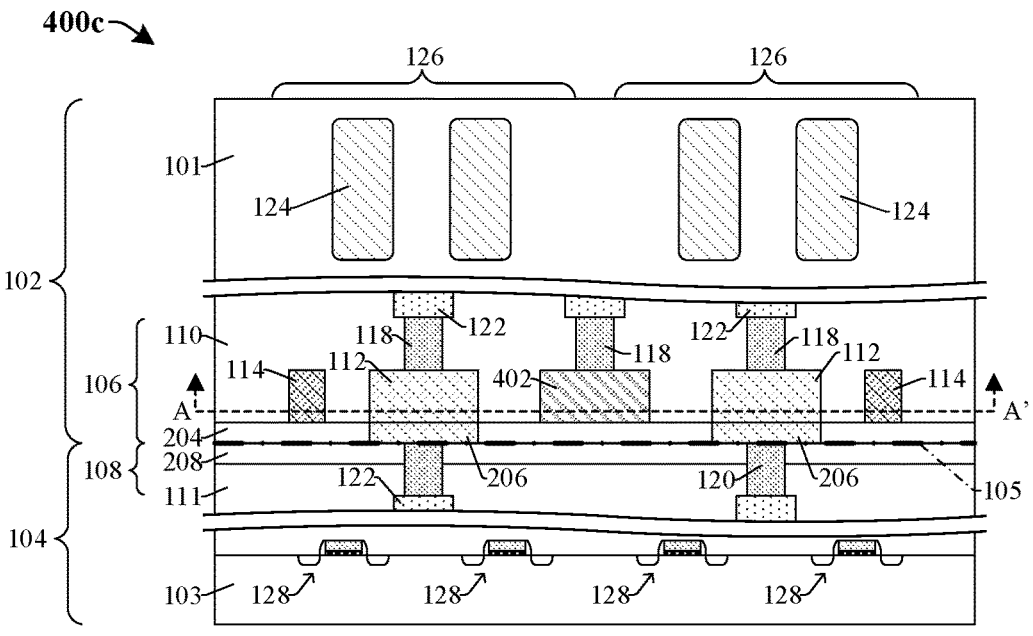

FIG. 4C illustrates a cross-sectional view 400c of some other embodiments of the stacked IC device of FIG. 2B, where the first plurality of dummy bond pads 402 are separated from the first bond interface 105 by the first dielectric layer 204.

Figure 5:
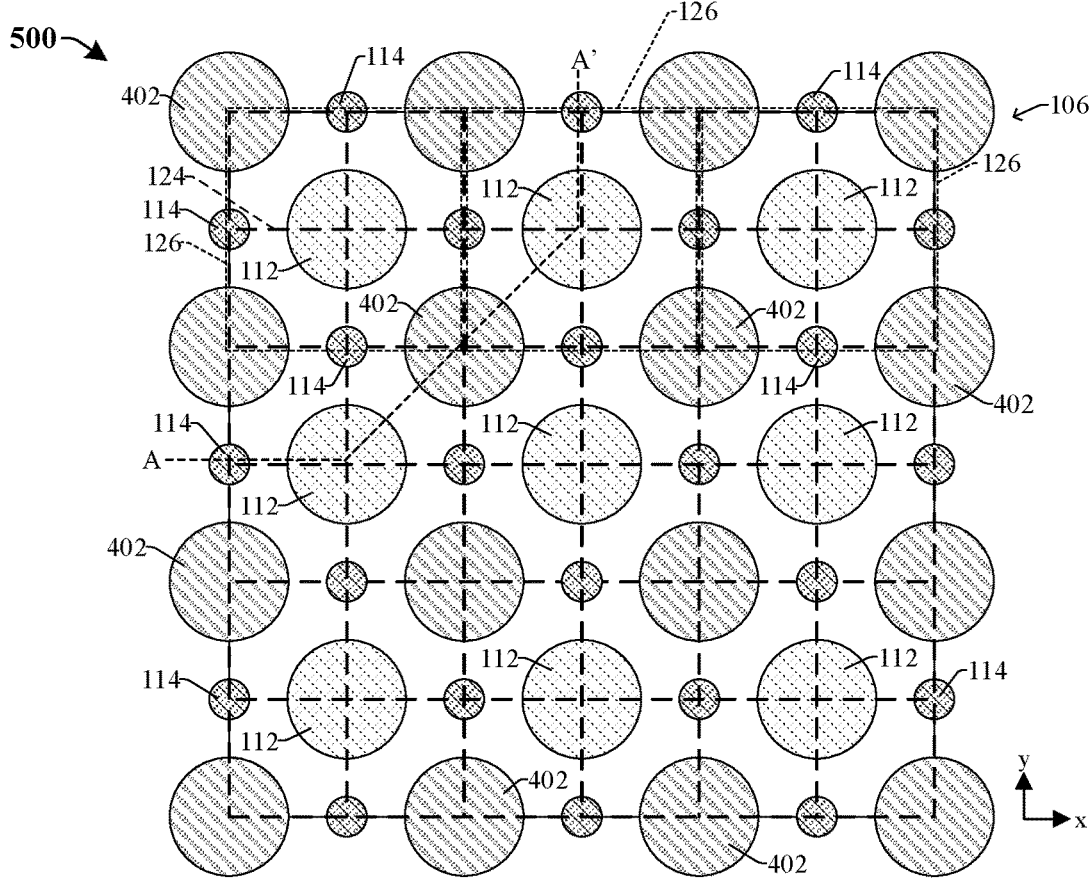
FIG. 5 illustrates a top view of some embodiments of the stacked IC device of FIGS. 4A-4C.

FIG. 5 illustrates a top view 500 of some embodiments of the stacked IC devices of FIG. 4A-4C taken along the line A-A' of FIGS. 4A-4C.

As illustrated in FIG. 5, each dummy bond pad in the first plurality of dummy bond pads 402 is disposed between diagonally separated conductive bond pads in the first plurality of conductive bond pads 112. Further, in embodiments in which the second bond structure (108 of FIG. 4B) comprises the second plurality of dummy bond pads (404 of FIG. 4B), individual dummy bond pads in the second plurality of dummy bond pads (404 of FIG. 4B) underlie each dummy bond pad in the first plurality of dummy bond pads 402. In such embodiments, a layout of the second plurality of dummy bond pads (404 of FIG. 4B) is symmetrical with a layout of the first plurality of dummy bond pads 402.

Figure 6A:
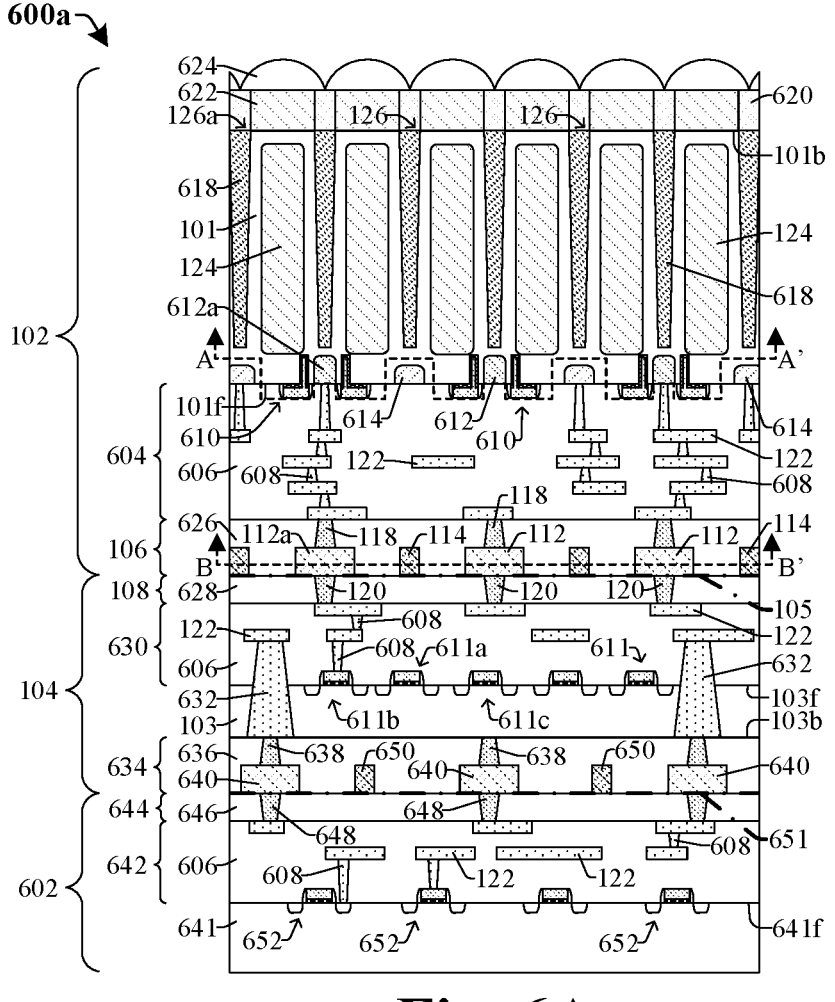
FIG. 6A illustrates a cross-sectional view of some embodiments of a stacked IC device comprising a plurality of photodetectors disposed on a first IC that is electrically coupled to a second IC chip by way of a bond structure having shield structures.

FIG. 6A illustrates a cross-sectional view 600a of some embodiments of a stacked IC device comprising a plurality of photodetectors disposed on a first IC chip electrically coupled to a second IC chip by way of a bond structure comprising shield structures.

The stacked IC device comprises a first IC chip 102 bonded to a second IC chip 104 at a first bond interface 105 and a third IC chip 602 bonded to the second IC chip 104 at a second bond interface 651. In some embodiments, the first IC chip 102 is configured as an imaging chip comprising a plurality of photodetectors 124 and a first plurality of transistors 610, the second IC chip 104 is configured as pixel device chip comprising a second plurality of transistors 611, and the third IC chip 602 is configured as an ASIC chip comprising a third plurality of transistors 652. In various embodiments, a plurality of pixels 126 span the first and second IC chips 102, 104, where the pixels 126 each comprise photodetectors from the plurality of photodetectors 124 and transistors from the first plurality of transistors 610 and the second plurality of transistors 611.

The first IC chip 102 comprises a first substrate 101, a first interconnect structure 604 disposed on a front side 101f of the first substrate, and a first bond structure 106 disposed on the first interconnect structure 604. The first substrate 101 may, for example, be or comprise silicon, monocrystalline silicon, CMOS bulk, silicon-germanium, a silicon-on-insulator (SOI) substrate, or some other semiconductor substrate and has a first doping type (e.g., p-type). The plurality of photodetectors 124 are disposed within the first substrate 101 and may have a second doping type (e.g., n-type) opposite the first doping type (e.g., p-type). In some embodiments, the first doping type is p-type and the second doping type is n-type, or vice versa. In addition, a plurality of floating diffusion nodes 612 are disposed in the first substrate 101. The floating diffusion nodes 612 may each be disposed at a crossroad of adjacent photodetectors 124. Further, the floating diffusion nodes 612 comprise the second doping type (e.g., n-type).

An isolation structure 618 extends into a back side 101b of the first substrate 101. The isolation structure 618 may be configured as a back-side deep trench isolation (DTI) structure and may be or comprise a dielectric material (e.g., silicon dioxide, silicon nitride, a metal oxide, etc.), a metal material (e.g., tungsten, aluminum, titanium nitride, etc.), some other suitable material, or any combination of the foregoing. A plurality of well regions 614 are disposed within the first substrate 101 between adjacent floating diffusion nodes 612. The well regions 614 comprise the first doping type (e.g., p-type) and are configured to increase electrical isolation between adjacent pixels in the plurality of pixels 126. A grid structure 620 overlies the back side 101b of the first substrate 101 and comprises sidewalls defining a plurality of grid openings over each photodetector 124. A plurality of light filters 622 (e.g., light filters) overlies the back side 101b of the first substrate 101 and are disposed in the plurality of grid openings. Further, a plurality of microlenses 624 overlie the light filters 622 and are configured to focus incident light towards the underlying photodetectors 124.

The first plurality of transistors 610 are disposed on the front side 101f of the first substrate 101. The first plurality of transistors 610 are configured as transfer transistors that are configured to transfer accumulated charge from the photodetectors 124 to a corresponding floating diffusion node 612. For example, the first plurality of transistors 610 may be biased to form selectively conductive channel(s) within the first substrate 101 between the photodetectors 124 and the corresponding floating diffusion node 612. Thus, the first plurality of transistors 610 may selectively electrically couple the photodetectors 124 to the corresponding floating diffusion node 612. The first plurality of transistors 610 comprise individual gate dielectric structures stacked with individual gate electrodes (not labeled), where the gate dielectric structure is disposed between the first substrate 101 and the gate electrode. In some embodiments, the first plurality of transistors 610 may be configured as vertical transistors.

The second IC chip 104 underlies the first IC chip 102. In some embodiments, the second IC chip 104 comprises a second substrate 103, a second interconnect structure 630 disposed on a front side 103f of the second substrate 103, and a second bond structure 108 disposed on the second interconnect structure 630. The second substrate 103 may, for example, be or comprise silicon, monocrystalline silicon, CMOS bulk, silicon-germanium, an SOI substrate, or some other semiconductor substrate. The second plurality of transistors 611 are disposed on the front side 103f of the second substrate 103. In some embodiments, the second plurality of transistors 611 are configured as readout transistors. The second plurality of transistors 611 are configured to conduct readout of the accumulated charge of the photodetectors 124. In some embodiments, the second plurality of transistors 611 comprise a reset transistor, a source-follower transistor, and a select transistor individual to each pixel in the plurality of pixels 126. For instance, the second plurality of transistors 611 comprise a reset transistor 611a and a source-follower transistor 611b, and a select transistor 611c individual to a first pixel 126a of the plurality of pixels 126. The second plurality of transistors 611 respectively comprise an individual gate dielectric structure stacked with an individual gate electrode (not labeled) and a pair of source/drain regions (not labeled) disposed on opposing sides of the individual gate electrode. Source/drain region(s) may refer to a source or a drain, individually or collectively dependent upon the context. In some embodiments, the first plurality of transistors 610 and/or the second plurality of transistors 611 are metal-oxide-semiconductor field-effector transistors (MOSFETs), fin field-effect transistors (FinFETs), gate-all-around field-effect transistors (GAA FETs), nanosheet field-effect transistors, the like, or any combination of the foregoing.

In some embodiments, the first and second interconnect structures 604, 630 respectively comprise a plurality of conductive wires 122 and a plurality of conductive vias 608 disposed within an interconnect dielectric structure 606. The interconnect dielectric structure 606 may comprise a plurality of dielectric layers that may, for example, be or comprise silicon dioxide, a low-k dielectric material, an extreme low-k dielectric material, some other dielectric material, or any combination of the foregoing. The conductive vias and wires 608, 122 may, for example, be or comprise copper, aluminum, titanium nitride, tantalum nitride, tungsten, ruthenium, some other conductive material, or any combination of the foregoing.

In some embodiments, the first bond structure 106 comprises a first plurality of conductive bond pads 112, a first plurality of bond contacts 118, and a first plurality of shield structures 114 disposed within a first bond dielectric structure 626. The first plurality of shield structures 114 are disposed between adjacent conductive bond pads in the first plurality of conductive bond pads 112. In further embodiments, the second bond structure 108 comprises a second plurality of bond contacts 120 disposed within a second bond dielectric structure 628. Accordingly, the second bond structure 108 comprises a single layer of conductive bond features. The first bond structure 106 is bonded to the second bond structure 108 at a first bond interface 105. Further, the first bond structure 106 and/or the second bond structure 108 may be configured as illustrated and/or described in FIG. 1A-1B, 2A-2B, 3A-3E, 4A-4C, or 5.

The first IC chip 102 is electrically coupled to the second IC chip 104 by way of the first and second bond structures 106, 108. In some embodiments, floating diffusion nodes 612 of the pixels 126 may be directly electrically coupled to corresponding transistor(s) in the second plurality of transistors 611 by way of the interconnect structures 604, 630 and the bond structures 106, 108. For example, a first floating diffusion node 612a of the first pixel 126a may be directly electrically coupled to a gate of the source-follower transistor 611b by way of a first conductive bond pad 112a.

During operation of the stacked IC device, accumulated charge from photodetectors of the pixels 126 may be readout on a column-by-column basis. For example, accumulated charge from photodetectors of the first pixel 126a may be transferred from the first floating diffusion node 612a to the gate of the source-follower transistor 611b by way of the first conductive bond pad 112a. By virtue of the first plurality of shield structures 114 being disposed between the first conductive bond pad 112a and adjacent conductive bond pads, parasitic capacitance and inductance between the first conductive bond pad 112a and the adjacent conductive bond pads is reduced. As a result, the accumulated charge transferred through the first conductive bond pad 112a has a reduced effect on the other adjacent conductive bond pads in the first plurality of conductive bond pads 112 during readout. Accordingly, crosstalk between adjacent conductive bond pads in the first plurality of conductive bond pads 112 is reduced. Therefore, an overall performance of the stacked IC device is increased (e.g., an accuracy of an image output from the plurality of pixels 126).

In various embodiments, an individual conductive bond pad in the first plurality of conductive bond pads 112 directly underlies a floating diffusion node of a corresponding pixel. For example, the first conductive bond pad 112a directly underlies the first floating diffusion node 612a of the first pixel 126a. By disposing the first plurality of conductive bond pads 112 directly under floating diffusion nodes of a corresponding pixel, a complexity of electrical routing in the first and second IC chips 102, 104 is reduced. This may decrease a number of conductive structures in the first and/or second interconnect structures 604, 630 and/or decreases design complexity of the stacked IC device.

The second IC chip 104 further comprises a third bond structure 634 disposed on a back side 103b of the second substrate 103 and a plurality of through substrate vias (TSVs) 632 extending through the second substrate 103. The TSVs 632 are configured to electrically couple the third bond structure 634 to the second interconnect structure 630.

In some embodiments, the third bond structure 634 comprises a third plurality of conductive bond pads 640, a third plurality of bond contacts 638, and a third plurality of shield structures 650 disposed within a third bond dielectric structure 636. The third plurality of conductive bond pads 640 may be electrically coupled to conductive wires 122 of the second interconnect structure 630 by way of the TSVs 632 and the third plurality of bond contacts 638. In various embodiments, the third plurality of shield structures 650 are disposed between adjacent conductive bond pads in the third plurality of conductive bond pads 640. The third plurality of shield structures 650 are configured to decrease parasitic capacitance and inductance between the adjacent conductive bond pads in the third plurality of conductive bond pads 640, thereby decreasing crosstalk between the adjacent conductive bond pads.

In various embodiments, the third IC chip 602 comprises a third substrate 641, a third interconnect structure 642 disposed on a front side 641f of the third substrate 641, and a fourth bond structure 644 disposed on the third interconnect structure 642. The third plurality of transistors 652 is disposed on the front side 641f of the third substrate 641. In some embodiments, the third plurality of transistors 652 are MOSFETs, FinFETs, GAA FETs, nanosheet field-effect transistors, the like, or any combination of the foregoing. In some embodiments, the third plurality of transistors 652 are part of the ASIC configured to perform image signal processing (ISP) on corresponding electrical signals from the pixels 126. The fourth bond structure 644 is configured to electrically couple the second IC chip 104 to the third plurality of transistors 652. In some embodiments, the third interconnect structure 642 comprises a plurality of conductive wires 122 and a plurality of conductive vias 608 disposed within an interconnect dielectric structure 606. In some embodiments, the fourth bond structure 644 comprises a fourth plurality of bond contacts 648 disposed within a fourth bond dielectric structure 646. The third bond structure 634 meets the fourth bond structure 644 at a second bond interface 651 that comprises dielectric-to-dielectric bonds and conductor-to-conductor bonds. In various embodiments, the fourth bond structure 644 comprises a single layer of conductive bond features (e.g., the fourth plurality of bond contacts 648). In various embodiments, the third bond structure 634 may be configured as the first bond structure 106 and the fourth bond structure 644 may be configured as the second bond structure 108. In yet further embodiments, layouts of the third and fourth bond structures 634, 644 may be the same as one another and may be different from the first and second bond structures 106, 108.

Figure 6B:
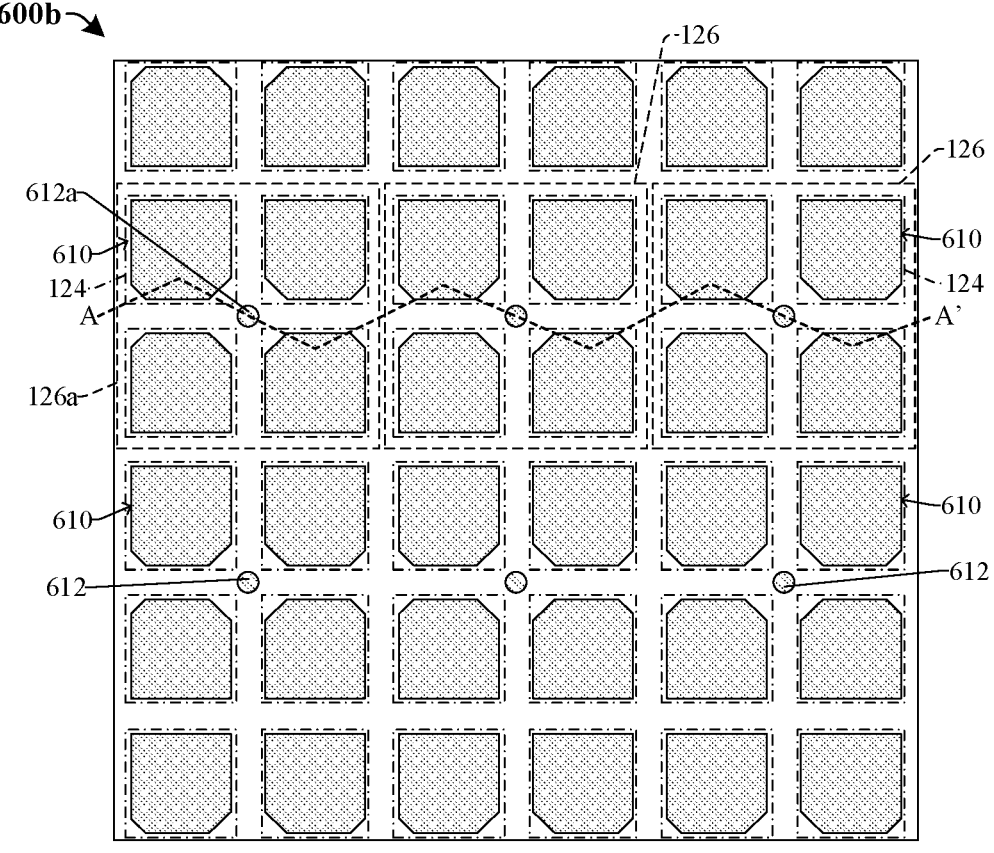
FIG. 6B illustrates a top view of some embodiments of the stacked IC device of FIG. 6A taken along the line A-A' of FIG. 6A.

FIG. 6B illustrates a top view 600b of some embodiments of the stacked IC device of FIG. 6A taken along the line A-A' of FIG. 6A.

As illustrated in FIG. 6B, the pixels 126 each have a 2×2 pixel layout comprising 4 photodetectors. In various embodiments, the pixels 126 may comprise 4 photodetectors arranged in a 2×2 array, 8 photodetectors arranged in a 2×4 array, or some other suitable layout. The floating diffusion nodes 612 are each disposed at a crossroad of the 4 photodetectors of each pixel. For example, the first pixel 126a comprises the first floating diffusion node 612a disposed at a crossroad of the photodetectors of the first pixel 126a. Further, a transistor in the first plurality of transistors 610 overlies and/or is adjacent to each photodetector in the plurality of photodetectors 124.

Figure 6C:
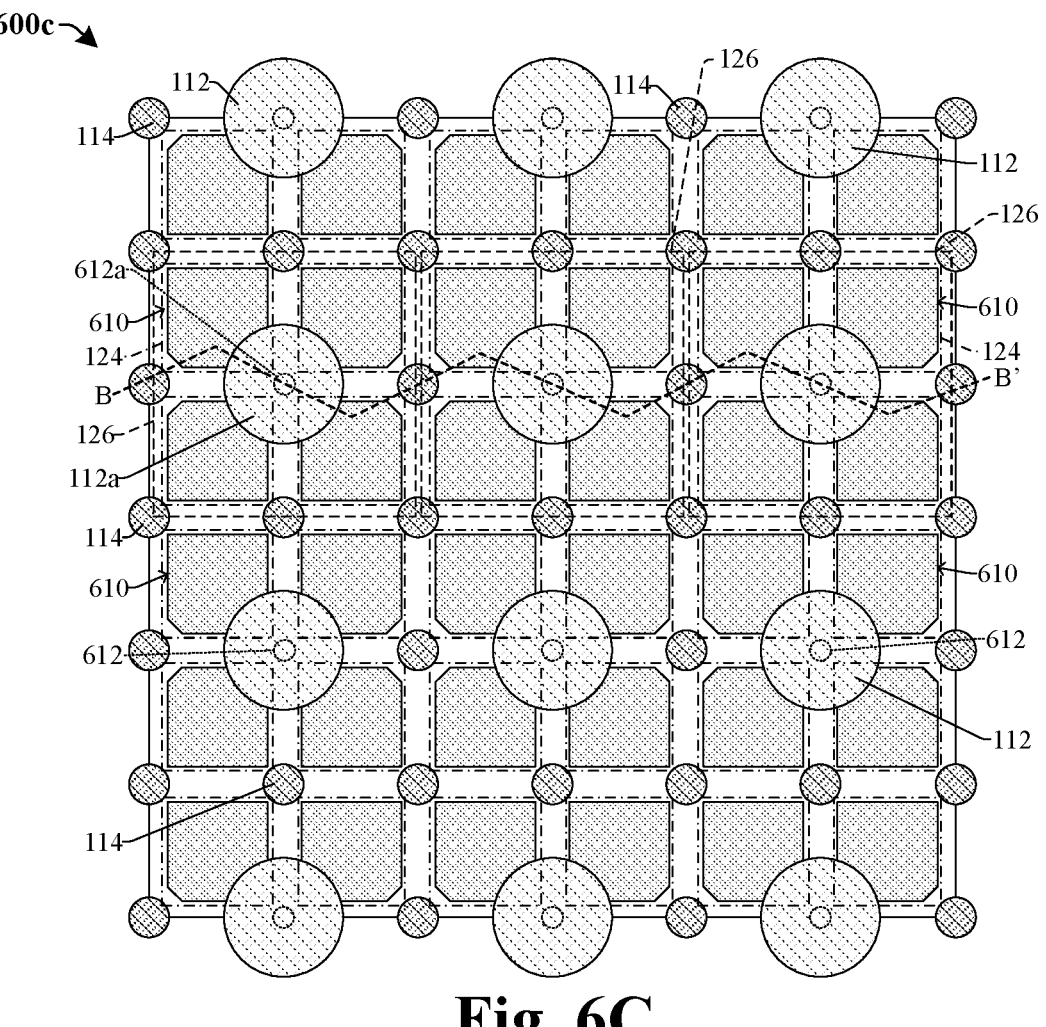
FIG. 6C illustrates a top view of some embodiments of the stacked IC device of FIG. 6A taken along the line B-B' of FIG. 6A.

FIG. 6C illustrates a top view 600c of some embodiments of the stacked IC device of FIG. 6A taken along the line B-B' of FIG. 6A. It will be appreciated that various structures (e.g., the first interconnect structure 604 and the first bond dielectric structure 626 of FIG. 6A) from the cross-sectional view 600a of FIG. 6A are omitted from the top view 600c of FIG. 6C for case of illustration.

As illustrated in FIG. 6C, an individual conductive bond pad in the first plurality of conductive bond pads 112 directly underlies a corresponding floating diffusion node in the plurality of floating diffusion nodes 612. For example, the first conductive bond pad 112a directly underlies the first floating diffusion node 612a.

Figure 7A:
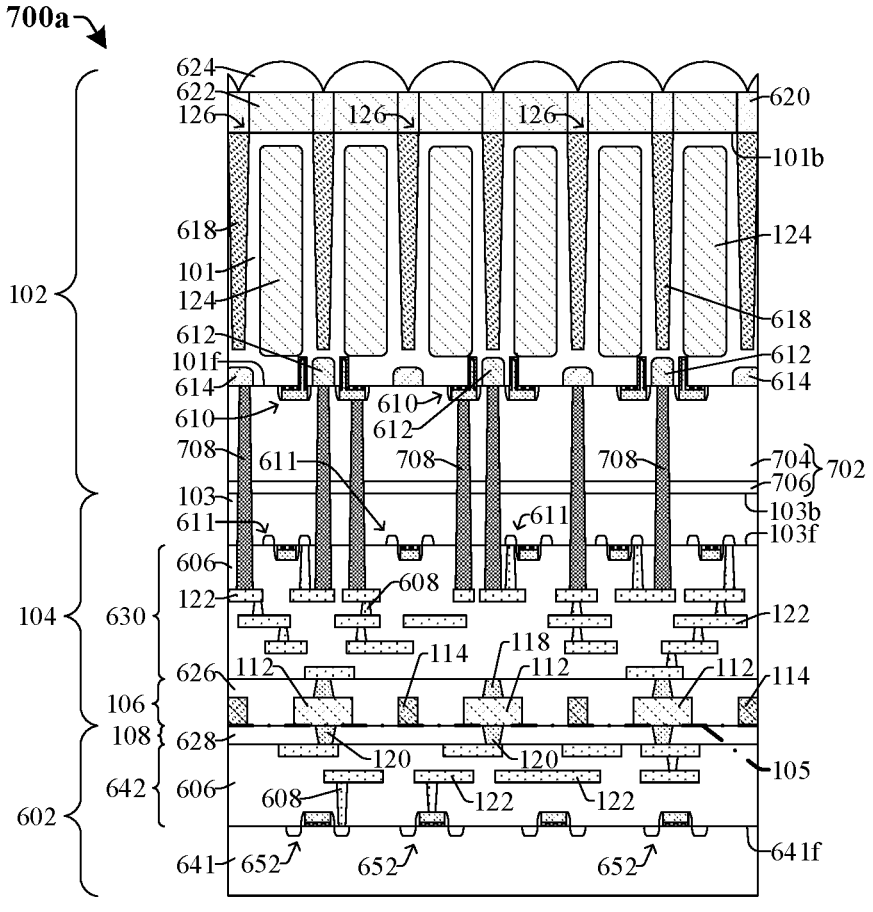
FIGS. 7A and 7B illustrate various cross-sectional views of some other embodiments of the stacked IC device of FIG. 6A.

FIG. 7A illustrates a cross-sectional view 700a of some other embodiments of the stacked IC device of FIG. 6A.

In various embodiments, as illustrated in FIG. 7A, the first IC chip 102 comprises the plurality of photodetectors 124, the first plurality of transistors 610, and a dielectric structure 702. The second IC chip 104 comprises the second plurality of transistors 611, the second interconnect structure 630, and the first bond structure 106. The third IC chip 602 comprises the third plurality of transistors 652, the third interconnect structure 642, and the second bond structure 108. The first bond structure 106 is disposed on the second interconnect structure 630, and the second bond structure 108 is disposed on the third interconnect structure 642. The first and second bond structures 106, 108 meet at the first bond interface 105.

The dielectric structure 702 comprises a first dielectric layer 704 disposed on the front side 101f of the first substrate 101 and a second dielectric layer 706 disposed on the first dielectric layer 704. The second dielectric layer 706 is bonded to the back side 103b of the second substrate 103. A plurality of through substrate vias (TSVs) 708 continuously extend from conductive wires 122 in the second interconnect structure 630 through the second substrate 103 and the dielectric structure 702 to devices (e.g., the first plurality of transistors 610) and doped regions (e.g., floating diffusion nodes 612 and well regions 614) of the first IC chip 102. The TSVs 708 comprise a conductive material (e.g., copper, aluminum, titanium nitride, tungsten, etc.) and are configured to directly electrically couple the first IC chip 102 to the second IC chip 104. For example, the TSVs 708 directly electrically couple the floating diffusion nodes 612 to transistors in the second plurality of transistors 611 (e.g., to reset transistor(s) and/or source-follower transistor(s)).

Figure 7B:
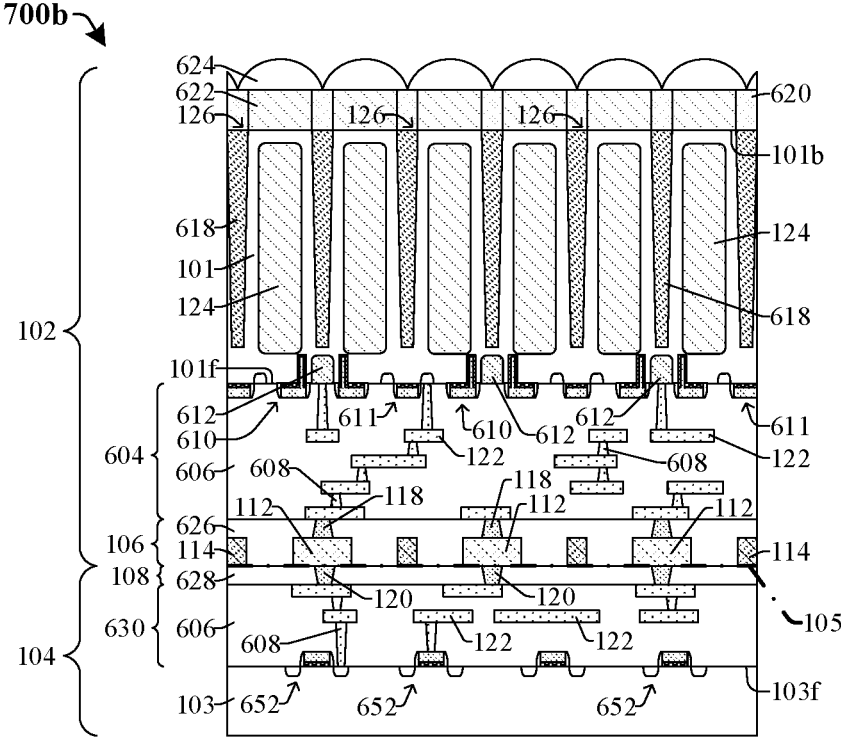

FIG. 7B illustrates a cross-sectional view 700b of some other embodiments of the stacked IC device of FIG. 6A.

In various embodiments, as illustrated in FIG. 7B, the first IC chip 102 comprises the plurality of photodetectors 124, the first plurality of transistors 610, the second plurality of transistors 611, the first interconnect structure 604, and the first bond structure 106. Further, the second IC chip 104 comprises the third plurality of transistors 652, the second interconnect structure 630, and the second bond structure 108. The first plurality of conductive bond pads 112 of the first bond structure 106 directly electrically couple transistors in the second plurality of transistors 611 to transistors in the third plurality of transistors 652.

Figure 8A:
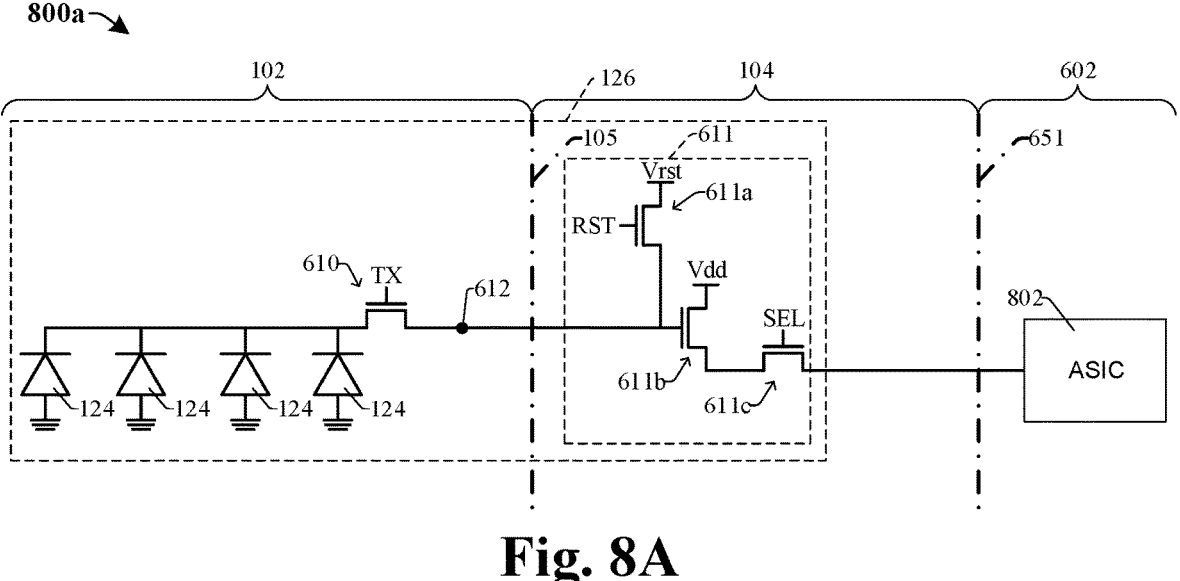
FIGS. 8A-8D illustrate circuit diagrams of some embodiments of a stacked IC device comprising a first IC chip electrically coupled to a second IC chip by way of a first bond interface.

FIG. 8A illustrates a circuit diagram 800a of some embodiments of a stacked IC device comprising a first IC chip bonded to a second IC chip. In some embodiments, the circuit diagram 800a of FIG. 8A may correspond to some embodiments of the stacked IC device of FIGS. 6A-6C.

A pixel 126 has a 2×2 pixel layout and spans the first and second IC chips 102, 104. The pixel 126 comprises the first plurality of transistors 610, photodetectors 124, and a floating diffusion node 612 disposed on the first IC chip 102 and the second plurality of transistors 611 disposed on the second IC chip 104. It will be appreciated that while the circuit diagram 800a illustrates an individual transistor for a set of four photodetectors 124, the first plurality of transistors 307 has a single transistor coupled between each photodetector 124 and the floating diffusion node 612. The third IC chip 602 comprises an ASIC 802. In various embodiments, the first and second IC chips 102, 104 are configured to conductive readout of the photodetectors 124, such that charge accumulated by the photodetectors 124 from incident radiation may be readout as a corresponding electrical signal. The electrical signal may be provided to the ASIC 802 for downstream signal process. For example, the ASIC 802 may be configured to perform analog-to-digital conversion (ADC), image processing, buffering, the like, or any combination of the foregoing.

The first plurality of transistors 610 are gated by a transfer signal TX and is configured to selectively transfer accumulated charge at the photodetectors 124 to the floating diffusion node 612. The second plurality of transistors 611 comprises the reset transistor 611a, the source-follower transistor 611b, and the select transistor 611c. The reset transistor 611a is coupled between the floating diffusion node 612 and a reset voltage Vrst. The reset transistor 611a is gated by a reset signal RST and is configured to selectively electrically couple the floating diffusion node 612 to the reset voltage Vrst to reset the floating diffusion node 612. Further, the reset transistor 611a may be configured to selectively electrically couple the photodetectors 124 to the reset voltage Vrst through coordination with the first plurality of transistors 610.

The source-follower transistor 611b is gated by a charge at the floating diffusion node 612. For example, a gate of the source-follower transistor 611b is directly electrically coupled to the floating diffusion node 612 through the first bond interface 105. The source-follower transistor 611b is coupled between a supply voltage Vdd and a source/drain region of the select transistor 611c. The source-follower transistor 611b is configured to buffer and/or amplifier a voltage at the floating diffusion node 612 for a reading of the voltage. The select transistor 611c is configured to selectively pass the buffered and/or amplified voltage from the source-follower transistor 611b to an output of the pixel 126. The output of the pixel 126 is electrically coupled to the ASIC 802 through the second bond interface 651.

An individual conductive bond pad (112a of FIG. 6A) of the first bond structure (106 of FIG. 6A) is configured to directly electrically coupled the floating diffusion node 612 to the gate of the source-follower transistor 611b and/or a source/drain region of the reset transistor 611a at the first bond interface 105. By virtue of shield structures (114 of FIG. 6A) being disposed on opposing sides of the individual conductive bond pad (112a of FIG. 6A), signal interference from readout of a second floating diffusion node (not shown) of another pixel (not shown) adjacent to the pixel 126 at the first bond interface 105 is reduced. As a result, the quality of an image from the stacked IC device is increased.

Figure 8B:
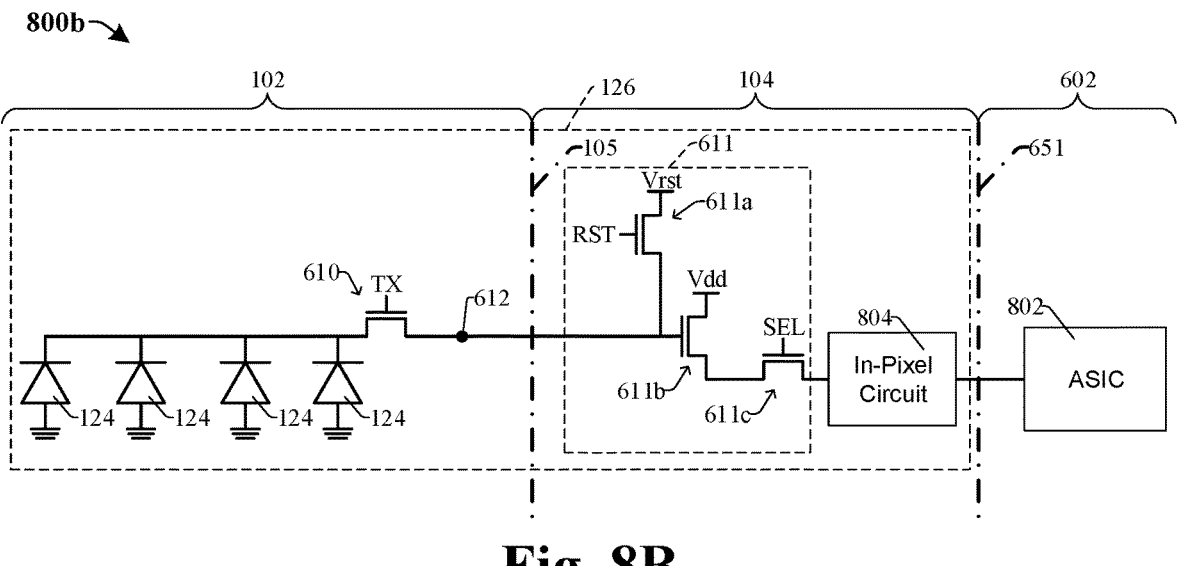

FIG. 8B illustrates a circuit diagram 800b of some other embodiments of the stacked IC device of FIG. 8A, where the second IC chip 104 further comprises an in-pixel circuit 804 electrically coupled between the second plurality of transistors 611 and the ASIC 802. In some embodiments, the in-pixel circuit 804 may comprise one or more additional transistors (e.g., logic transistors) and is configured to perform additional processing on the electrical signal from the select transistor 611c before passing the electrical signal to the ASIC 802.

Figure 8C:
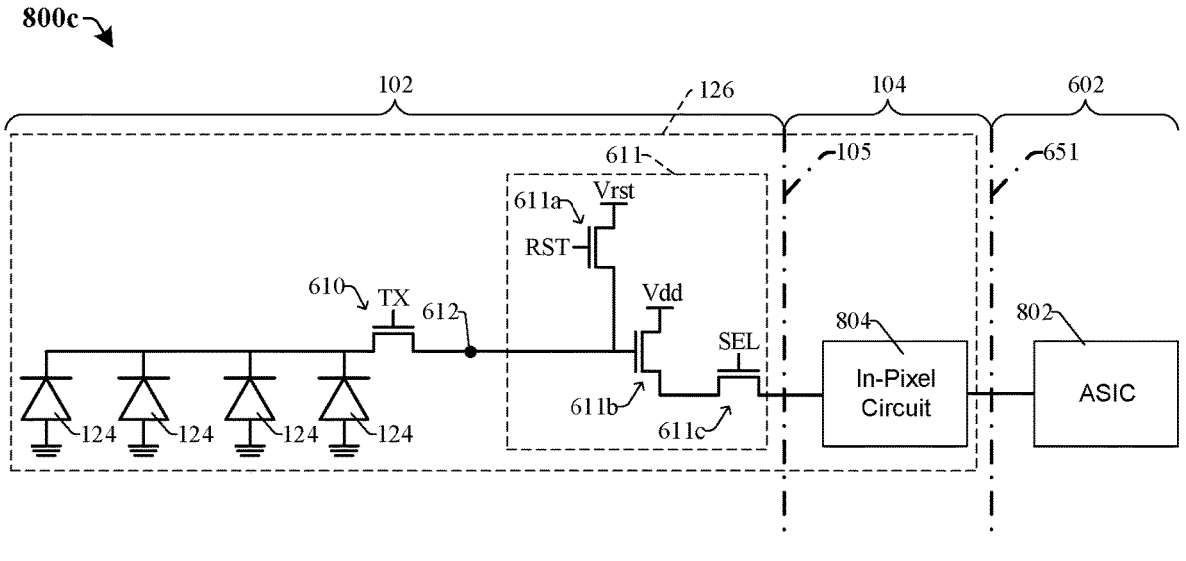

FIG. 8C illustrates a circuit diagram 800c of some other embodiments of the stacked IC device of FIG. 8B, where the second plurality of transistors 611 are disposed on the first IC chip 102.

Figure 8D:
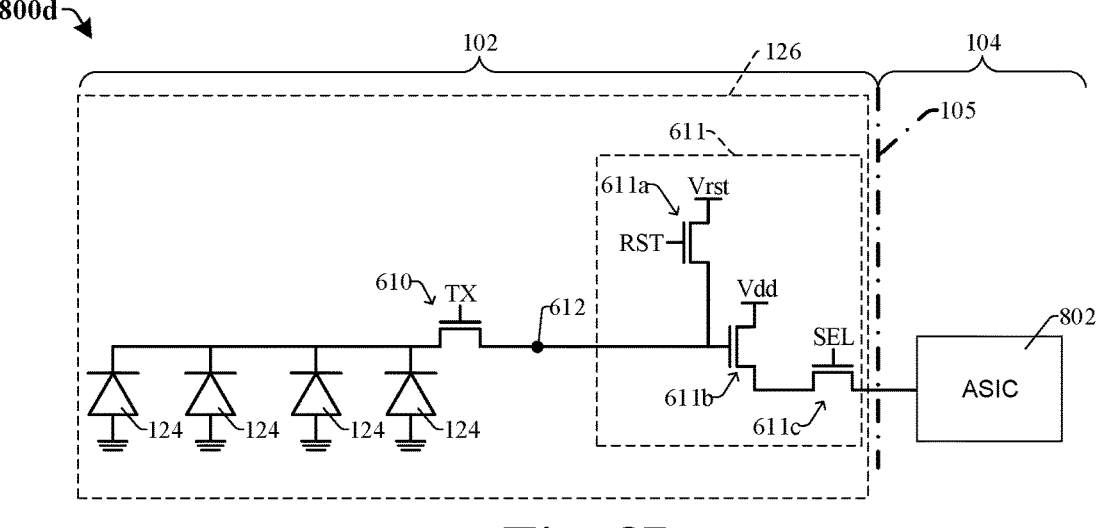

FIG. 8D illustrates a circuit diagram 800d of some other embodiments of the stacked IC device of FIG. 8A, where the third IC chip (602 of FIG. 8A) is omitted, the second plurality of transistors 611 are disposed on the first IC chip 102 and the ASIC 802 is disposed on the second IC chip 104. In some embodiments, the circuit diagram 800d may correspond to some embodiments of the stacked IC device of FIG. 7B.

FIGS. 9-21 illustrate various views 900-2100 of some embodiments of a method of forming a stacked IC device including a bond structure having shield structures. Although the various views 900-2100 shown in FIGS. 9-21 are described with reference to the method, it will be appreciated that the structures shown in FIGS. 9-21 are not limited to the method but rather may stand alone separate of the method. Furthermore, although FIGS. 9-21 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 9:
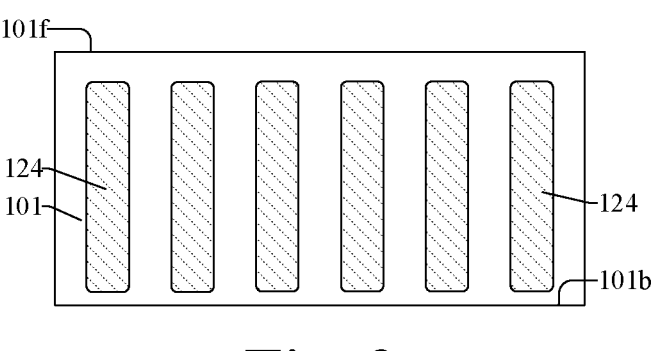
FIGS. 9-21 illustrate various views of some embodiments of a method of forming a stacked IC device including a bond structure having shield structures.

As shown in cross-sectional view 900 of FIG. 9, a plurality of photodetectors 124 are formed within a first substrate 101. The first substrate 101 may, for example, be or comprise silicon, monocrystalline silicon, epitaxial silicon, germanium, silicon germanium, another semiconductor material, or the like and may have a first doping type (e.g., p-type). In some embodiments, a process for forming the photodetectors 124 includes performing a selective ion implantation process. The selective ion implantation process may comprise implanting one or more dopants within the first substrate 101 according to a masking layer (not shown). In various embodiments, the photodetectors 124 comprise a second doping type (e.g., n-type) opposite the first doping type (e.g., p-type).

Figure 10:
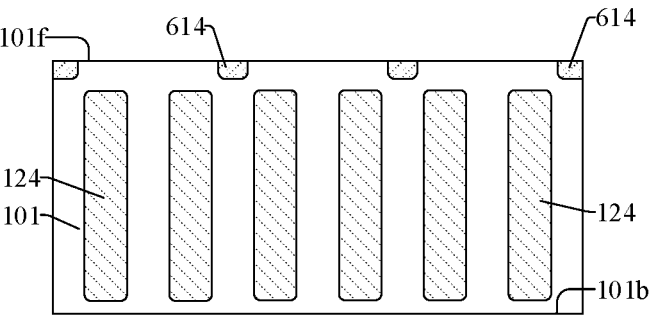

As shown in cross-sectional view 1000 of FIG. 10, a plurality of well regions 614 is formed within the first substrate 101. The well regions 614 comprise the first doping type (e.g., p-type) with a higher doping concentration than adjacent regions of the first substrate 101. In some embodiments, the well regions 614 are formed by a selective ion implantation process.

Figure 11:
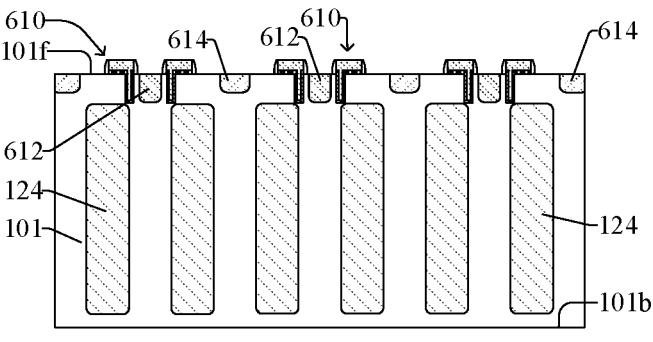

As shown in cross-sectional view 1100 of FIG. 11, a first plurality of transistors 610 and a plurality of floating diffusion nodes 612 are formed on and/or within the front side 101f of the first substrate 101. In some embodiments, a process for forming the first plurality of transistors 610 includes: selectively etching the front side 101f of the first substrate 101 to form trenches extending into the front side 101f of the first substrate 101; depositing (e.g., by physical vapor deposition (PVD), chemical vapor deposition (CVD), atomic layer deposition (ALD), etc.) a gate dielectric over the first substrate 101 and lining the trenches; depositing (e.g., by PVD, CVD, sputtering, electroplating, etc.) a gate electrode over the gate dielectric and in the trenches; performing a patterning process on the gate electrode and the gate dielectric; and forming a sidewall spacer structure along sidewalls of the gate electrode and the gate dielectric. A process for forming the floating diffusion nodes 612 includes selectively implanting one or more dopants within the first substrate 101. The floating diffusion nodes 612 comprise the second doping type (e.g., n-type). In some embodiments, the floating diffusion nodes 612 may be formed after forming the first plurality of transistors 610 such that the floating diffusion nodes 612 may be aligned according to sidewalls of the first plurality of transistors 610.

Figure 12:
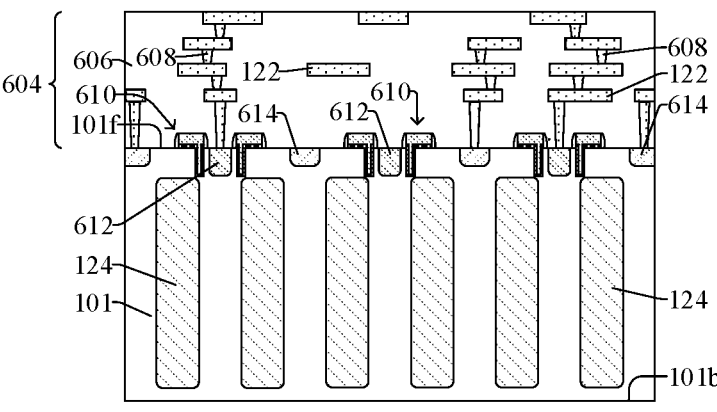

As shown in cross-sectional view 1200 of FIG. 12, a first interconnect structure 604 is formed on the front side 101*f* of the first substrate 101. The first interconnect structure 604 comprises a plurality of conductive wires 122 and a plurality of conductive vias 608 disposed within an interconnect dielectric structure 606. The interconnect dielectric structure 606 may be formed by one or more deposition processes such as PVD process(es), CVD process(es), ALD process(es), other suitable growth and/or deposition process(es), or any combination of the foregoing. In some embodiments, the plurality of conductive vias 608 and the plurality of conductive wires 122 are formed by one or more deposition process(es), one or more patterning process(es), one or more planarization process(es) some other suitable fabrication process(es), or any combination of the foregoing. For example, the plurality of conductive vias 608 and the plurality of conductive wires 122 may be formed by a single damascene process, a dual damascene process, etc.

Figure 13:
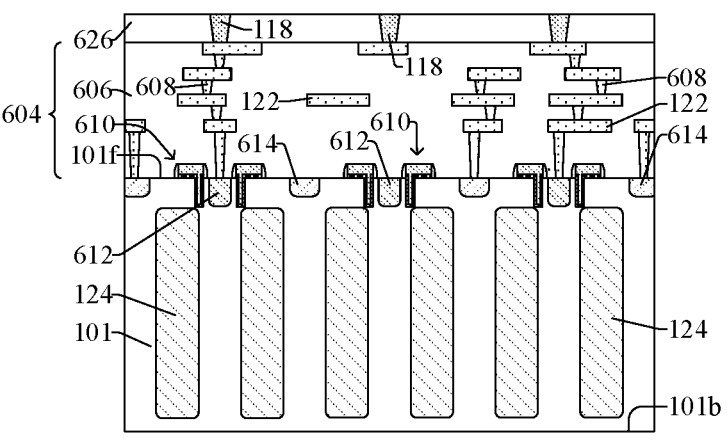

As shown in cross-sectional view 1300 of FIG. 13, a first bond dielectric structure 626 and a first plurality of bond contacts 118 are formed on the first interconnect structure 604. The first bond dielectric structure 626 is formed on the first interconnect structure 604 by a PVD process, a CVD process, an ALD process, or the like. The first bond dielectric structure 626 may, for example, be or comprise silicon oxynitride, silicon dioxide, silicon carbide, some other dielectric material, or any combination of the foregoing. In some embodiments, a process for forming the first plurality of bond contacts 118 includes: forming a masking layer (not shown) on the first bond dielectric structure 626; etching the first bond dielectric structure 626 with the masking layer in place to form a plurality of openings in the first bond dielectric structure 626; depositing (e.g., by CVD, PVD, ALD, sputtering, electroplating, etc.) a conductive material (e.g., copper, aluminum, tungsten, another conductive material, or any combination of the foregoing) within the openings; and performing a planarization process (e.g., a chemical mechanical planarization (CMP) process) on the conductive material.

Figure 14A:
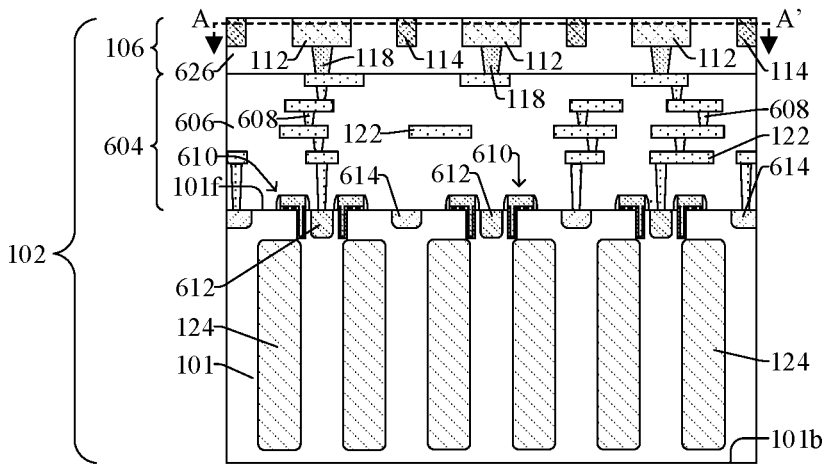
Figure 14B:
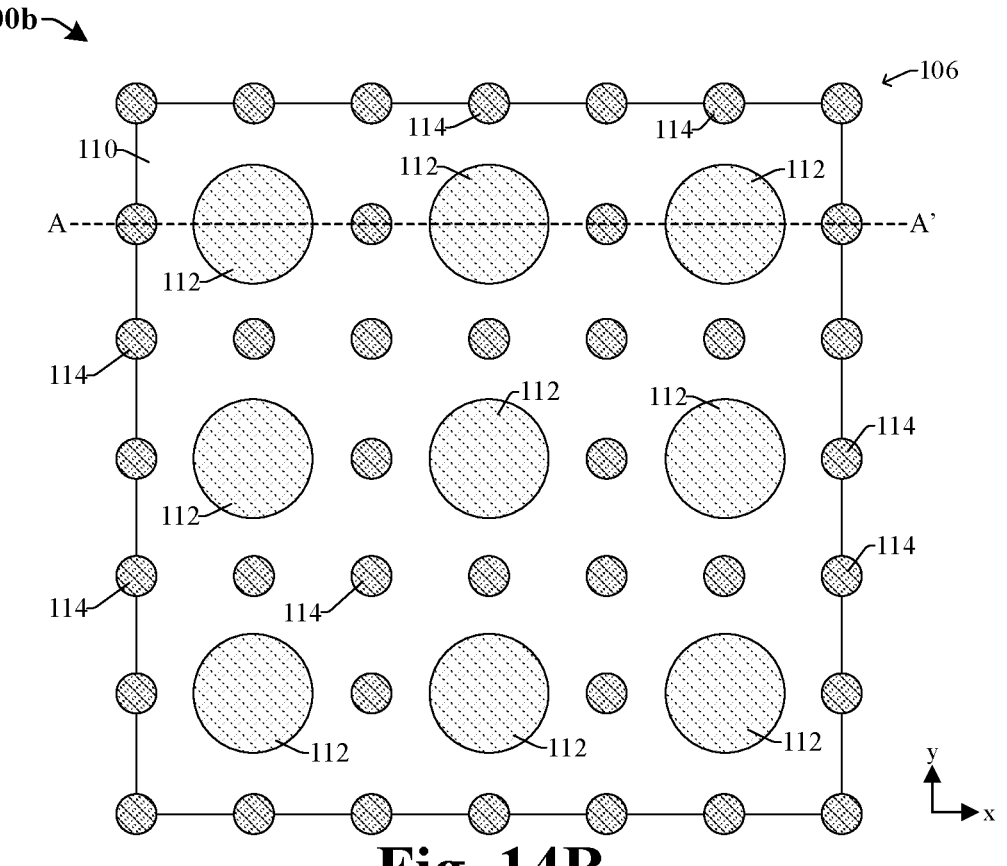

As shown in cross-sectional view 1400*a* of FIG. 14A and top view 1400*b* of FIG. 14B taken along line A-A' of the cross-sectional view 1400*a* of FIG. 14A, a first plurality of conductive bond pads 112 and a first plurality of shield structures 114 are formed over the first plurality of bond contacts 118, thereby defining a first bond structure 106 and a first IC chip 102. In some embodiments, a process for forming the first plurality of conductive bond pads 112 and the first plurality of shield structures 114 includes: depositing (e.g., by CVD, PVD, ALD, etc.) an upper dielectric layer on the first plurality of bond contacts 118; forming a masking layer (not shown) over the upper dielectric layer; etching the upper dielectric layer according to the masking layer to form a plurality of bond feature openings within the upper dielectric layer; performing a deposition process to deposit the first plurality of conductive bond pads 112 and the first plurality of shield structures 114 within the bond feature openings; and performing a planarization process (e.g., a CMP process) on the first plurality of conductive bond pads 112 and the first plurality of shield structures 114. The upper dielectric layer is part of the first bond dielectric structure 626 and may, for example, be or comprise silicon oxynitride, silicon dioxide, silicon carbide, some other dielectric material, or any combination of the foregoing.

In yet further embodiments, the deposition process includes: performing a first deposition process (e.g., CVD, PVD, ALD, electroplating, electroless plating, etc.) to deposit a conductive bond pad material (e.g., copper, aluminum, tungsten, etc.) in first openings of the plurality of bond feature openings that correspond to the first plurality of conductive bond pads 112; and performing a second deposition process (e.g., CVD, PVD, ALD, electroplating, electroless plating, etc.) to deposit a shield structure material (e.g., a metal material such as copper, aluminum, tungsten, or a dielectric material such as silicon dioxide, a low-k dielectric material, etc.) in second openings of the plurality of bond feature openings that correspond to the first plurality of shield structures 114. In some embodiments, the first deposition process is different from the second deposition process.

In various embodiments, the first plurality of conductive bond pads 112 and the first plurality of shield structures 114 comprise a same conductive material (e.g., copper, aluminum, gold, silver, tungsten, etc.). In yet further embodiments, the first plurality of shield structures 114 comprises a dielectric material (e.g., silicon dioxide, a low-k dielectric material, etc.) different from a conductive material (e.g., copper, aluminum, gold, silver, tungsten, etc.) of the first plurality of conductive bond pads 112. In some embodiments, the first plurality of conductive bond pads 112 and the first plurality of shield structures 114 are formed concurrently with one another. Further, in some embodiments, the first bond structure 106 may be formed such that the first bond structure 106 has a top view or layout as illustrated and/or described in any one of FIG. 1B, 3A-3E, or 5.

Figure 15:
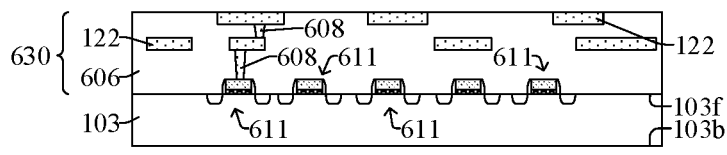

As shown in cross-sectional view 1500 of FIG. 15, a second substrate 103 is provided and a second plurality of transistors 611 and a second interconnect structure 630 are formed on a front side 103*f* of the second substrate 103. In some instances, the second plurality of transistors 611 and the second interconnect structure 630 are formed by process(es) substantially similar to process(es) described above regarding formation of the structure of the cross-sectional views of 1100 and 1200 of FIGS. 11 and 12.

Figure 16:
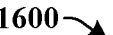
Figure 16:
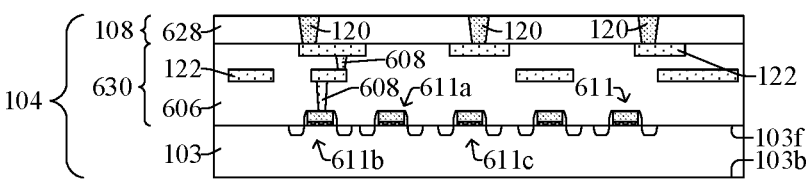

As shown in cross-sectional view 1600 of FIG. 16, a second bond structure 108 is formed on the second interconnect structure 630, thereby forming a second IC chip 104. In some embodiments, the second bond structure 108 comprises a second plurality of bond contacts 120 disposed within a second bond dielectric structure 628. The second bond dielectric structure 628 is formed on the second interconnect structure 630 by a PVD process, a CVD process, an ALD process, or the like. The second bond dielectric structure 628 may, for example, be or comprise silicon oxynitride, silicon dioxide, silicon carbide, some other dielectric material, or any combination of the foregoing. In some embodiments, a process for forming the second plurality of bond contacts 120 includes: forming a masking layer (not shown) on the second bond dielectric structure 628; etching the second bond dielectric structure 628 with the masking layer in place to form a plurality of openings in the second bond dielectric structure 628; depositing (e.g., by CVD, PVD, ALD, sputtering, electroplating, etc.) a conductive material (e.g., copper, aluminum, tungsten, another conductive material, or any combination of the foregoing) within the openings; and performing a planarization process (e.g., a CMP process) on the conductive material. In various embodiments, the second bond structure 108 comprises a single layer of conductive bond features (e.g., the second plurality of bond contacts 120).

Figure 17:
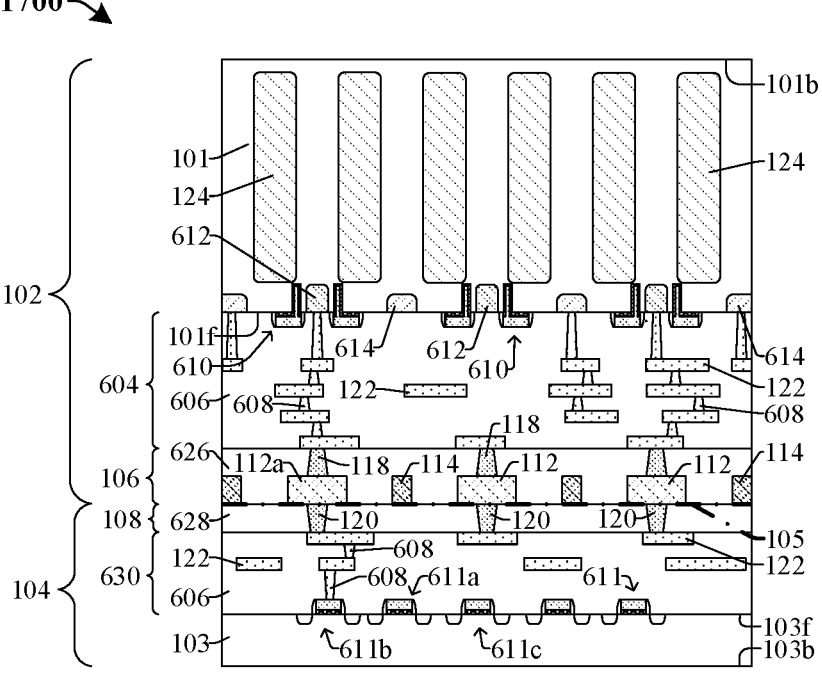

As shown in cross-sectional view 1700 of FIG. 17, the first IC chip 102 is bonded to the second IC chip 104. Bonding the first IC chip 102 to the second IC chip 104 includes: flipping the first IC chip 102 and aligning the first IC chip 102 with the second IC chip 104; applying pressure to the first and/or second IC chips 102, 104; and performing an annealing process on the first and second IC chips 102, 104 to form the first bond interface 105. The first bond interface 105 comprises dielectric-to-dielectric bonds and conductor-to-conductor bonds.

Figure 18:
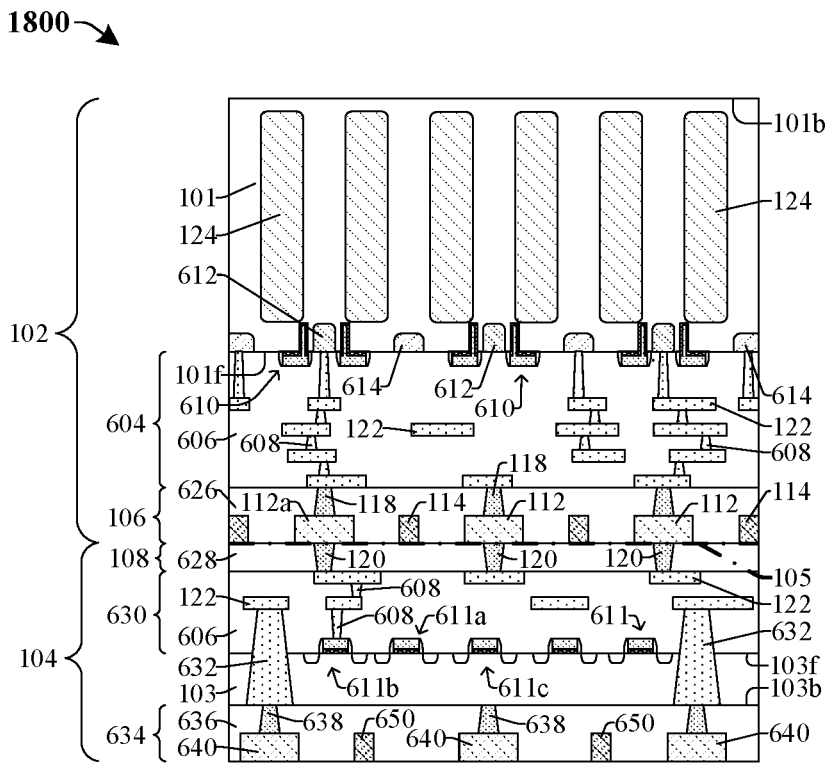

As shown in cross-sectional view 1800 of FIG. 18, a plurality of through substrate vias (TSVs) 632 and a third bond structure 634 are formed on and/or within the second substrate 103. The TSVs 632 continuously extend through the second substrate 103 and electrically coupled the third bond structure 634 to the second interconnect structure 630. In some embodiments, the third bond structure 634 comprises a third plurality of conductive bond pads 640, a third plurality of bond contacts 638, and a third plurality of shield structures 650 disposed within a third bond dielectric structure 636. In various embodiments, the third bond structure 634 is formed by process(es) substantially similar to process(es) described above regarding formation of the first bond structure 106 (e.g., as illustrated and/or described in FIGS. 13, 14A and 14B).

Figure 19:
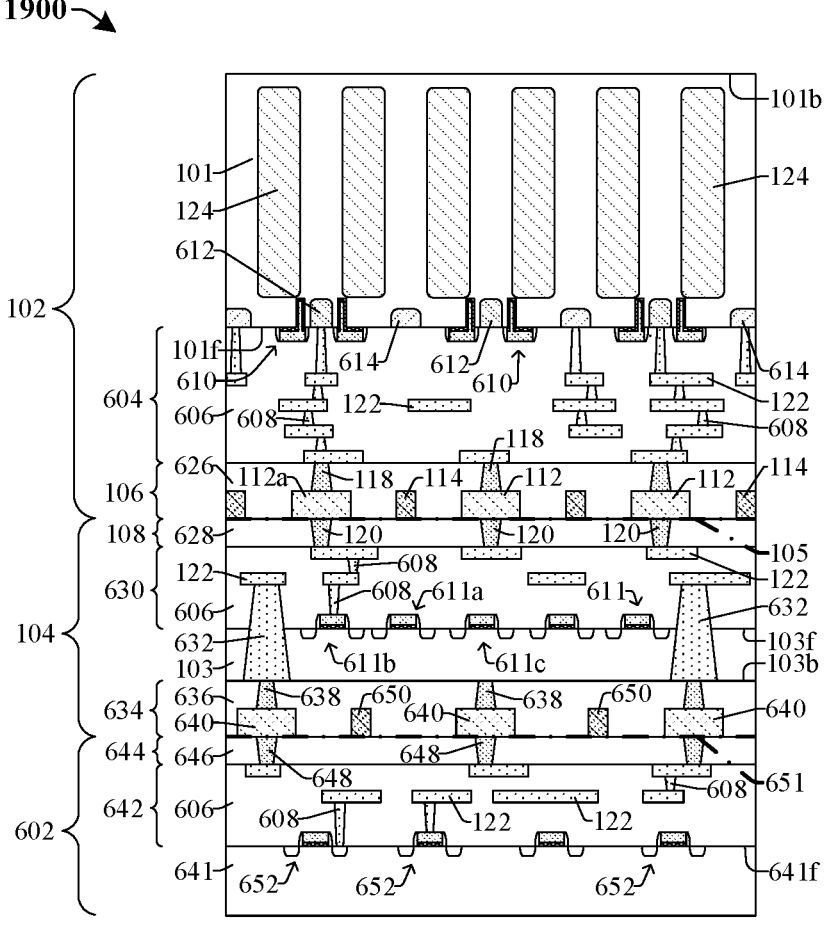

As shown in cross-sectional view 1900 of FIG. 19, the first and second IC chips 102, 104 are bonded to a third IC chip 602. In various embodiments, the third IC chip 602 is configured as illustrated and/or described in FIG. 6A. In some embodiments, bonding the third IC chip 602 to the first and second IC chips 102, 104 includes: aligning the third IC chip 602 with the first and second IC chips 102, 104; applying pressure to the first and second chips 102, 104 and/or the third IC chip 602; and performing an annealing process to form a second bond interface 651 between the second and third IC chips 104, 602.

Figure 20:
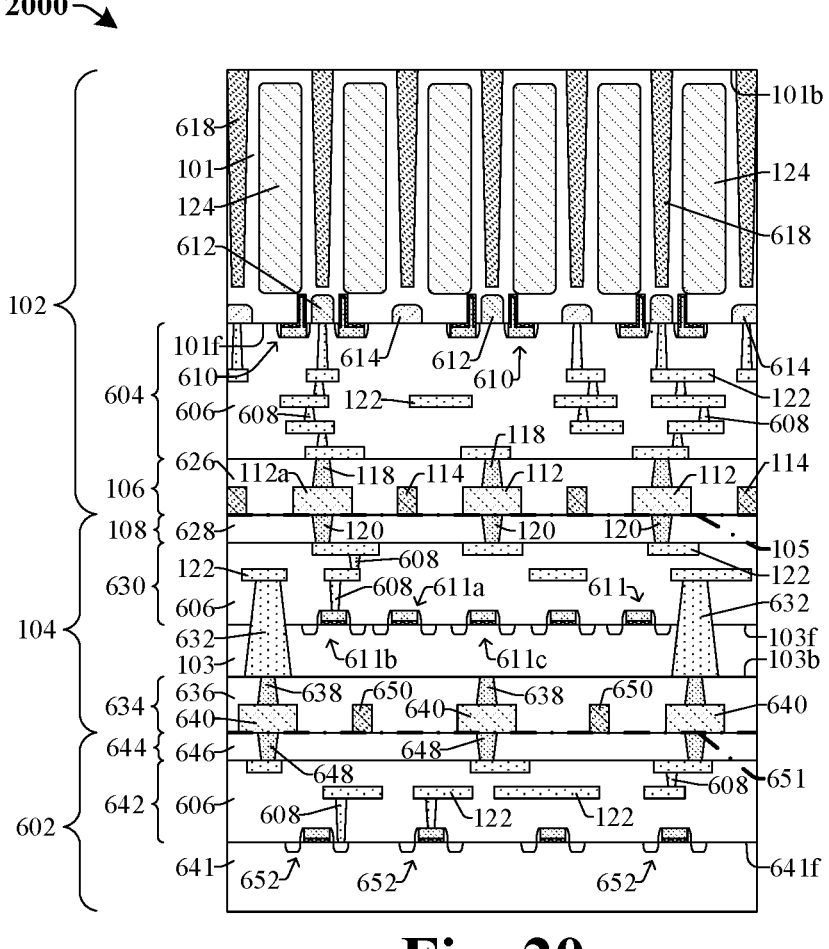

As shown in cross-sectional view 2000 of FIG. 20, an isolation structure 618 is formed extending into a back side 101*b* of the first substrate 101. In some embodiments, a process for forming the isolation structure 618 includes: selectively etching the back side 101*b* of the first substrate 101 to form a trench disposed between adjacent photodetectors 124; depositing (e.g., by CVD, PVD, ALD, etc.) an isolation structure material within the trench and over the first substrate 101; and performing a planarization process (e.g., a CMP process, an etching process, etc.) on the isolation structure material.

Figure 21:
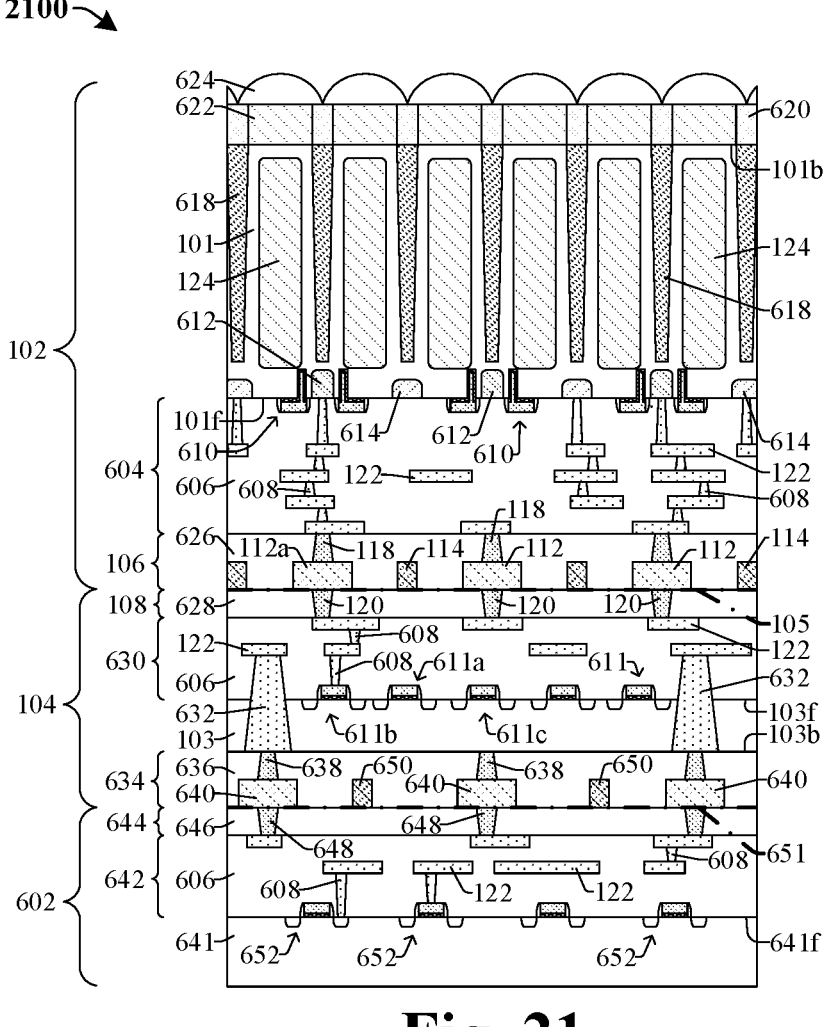

As shown in cross-sectional view 2100 of FIG. 21, a grid structure 620, a plurality of light filters 622, and a plurality of microlenses 624 are formed on the back side 101*b* of the first substrate 101. The grid structure 620 is formed by depositing a grid material over the first substrate 101 and patterning the grid material to form the grid structure 620. The light filters 622 may be formed by depositing and patterning respective color filter layers corresponding to the light filters 622. The microlenses 624 are formed by depositing a microlens material over the light filters 622 and patterning the microlens material to form the plurality of microlenses 624.

FIG. 22 illustrates some embodiments of a method 2200 of forming a stacked IC device including a bond structure having shield structures. Although the method 2200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2202, a plurality of photodetectors are formed within a first substrate of a first integrated circuit (IC) chip. FIG. 9 illustrates a cross-sectional view 900 corresponding to some embodiments of act 2202.

At act 2204, a first plurality of transistors and a plurality of floating diffusion nodes are formed on and/or within a front side of the first substrate. FIG. 11 illustrates a cross-sectional view 1100 corresponding to some embodiments of act 2204.

At act 2206, a first interconnect structure is formed on the front side of the first substrate. FIG. 12 illustrates a cross-sectional view 1200 corresponding to some embodiments of act 2206.

At act 2208, a first bond structure is formed on the first interconnect structure. The first bond structure comprises a first plurality of bond contacts, a first plurality of conductive bond pads, and a first plurality of shield structures disposed between adjacent conductive bond pads in the first plurality of conductive bond pads. FIGS. 13, 14A, and 14B illustrate various views 1300, 1400*a*, and 1400*b* corresponding to some embodiments of act 2208.

At act 2210, a second plurality of transistors and a second interconnect structure are formed on a front side of a second substrate of a second IC chip. FIG. 15 illustrates a cross-sectional view 1500 corresponding to some embodiments of act 2210.

At act 2212, a second bond structure is formed on the second interconnect structure, where the second bond structure comprises a second plurality of bond contacts. FIG. 16 illustrates a cross-sectional view 1600 corresponding to some embodiments of act 2212.

At act 2214, the first IC chip is bonded to the second IC chip such that the first bond structure meets the second bond structure at a first bond interface. The first plurality of conductive bond pads contact the second plurality of bond contacts at the first bond interface. FIG. 17 illustrates a cross-sectional view 1700 corresponding to some embodiments of act 2214.

At act 2216, the second IC chip is bonded to a third IC chip such that the second and third IC chips meet at a second bond interface. FIG. 19 illustrates a cross-sectional view 1900 corresponding to some embodiments of act 2216.

At act 2218, a grid structure, a plurality of light filters, and a plurality of microlenses are formed on a back side of the first substrate. FIG. 20 illustrates a cross-sectional view 2000 corresponding to some embodiments of act 2218.

Accordingly, in some embodiments, the present disclosure relates to a stacked IC device comprises a first IC chip with a first bond structure bonded to a second bond structure of a second IC chip, where the first bond structure comprises shield structures disposed between adjacent conductive bond pads.

In some embodiments, the present application provides an integrated circuit (IC) including: a first IC chip comprising a plurality of photodetectors disposed in a first substrate and a first bond structure, wherein the first bond structure comprises a first plurality of bond contacts disposed on a first plurality of conductive bond pads; a second IC chip comprising a second bond structure and a second substrate, wherein a first bond interface is disposed between the first bond structure and the second bond structure, wherein the second bond structure comprises a second plurality of bond contacts; and wherein the first bond structure further comprises a first plurality of shield structures disposed between adjacent conductive bond pads in the first plurality of conductive bond pads.

In some embodiments, the present application provides an integrated circuit (IC) including: a first IC chip comprising a first substrate, a first interconnect structure on the first substrate, a first bond structure on the first interconnect structure, and a first pixel, wherein the first pixel comprises a plurality of photodetectors disposed within the first substrate and a floating diffusion node disposed at a crossroad of the plurality of photodetectors; and a second IC chip comprising a second substrate, a second interconnect structure on the second substrate, and a second bond structure disposed on the second interconnect structure, wherein the first bond structure contacts the second bond structure at a first bond interface; and wherein the first bond structure comprises a first plurality of bond contacts, a first plurality of conductive bond pads, and a first plurality of shield structures, wherein the first plurality of conductive bond pads comprises a first conductive bond pad directly underlying the floating diffusion node and a second conductive bond pad laterally adjacent to the first conductive bond pad, wherein the first plurality of shield structures comprises a first shield structure disposed laterally between the first conductive bond pad and the second conductive bond pad.

In various embodiments, the present application provides a method for forming an integrated circuit (IC), the method including: forming a plurality of photodetectors within a first substrate; forming a first interconnect structure on a front side of the first substrate; forming a first bond structure on the first interconnect structure, wherein the first bond structure comprises a first plurality of bond contacts, a first plurality of conductive bond pads, and a first plurality of shield structures disposed within a first bond dielectric structure, wherein the first plurality of shield structures are disposed between adjacent conductive bond pads in the first plurality of conductive bond pads; forming a second interconnect structure on a second substrate; forming a second bond structure on the second interconnect structure; and bonding the first bond structure to the second bond structure at a first bond interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC), the method comprising:

forming a plurality of photodetectors within a first substrate;

forming a first interconnect structure on a front side of the first substrate;

forming a first bond structure on the first interconnect structure, wherein the first bond structure comprises a first plurality of bond contacts, a first plurality of conductive bond pads, and a first plurality of shield structures disposed within a first bond dielectric structure, wherein the first plurality of shield structures are disposed between adjacent conductive bond pads in the first plurality of conductive bond pads;

forming a second interconnect structure on a second substrate;

forming a second bond structure on the second interconnect structure; and bonding the first bond structure to the second bond structure at a first bond interface.

2. The method of claim 1, wherein the first plurality of conductive bond pads comprises a first conductive bond pad, wherein a first subset of the first plurality of shield structures is disposed around an outer perimeter of the first conductive bond pad, wherein a width or diameter of each shield structure in the first subset of the first plurality of shield structures is less than a width or diameter of the first conductive bond pad.

3. The method of claim 1, wherein the first plurality of conductive bond pads comprise a first material and the first plurality of shield structures comprise a second material different from the first material.

4. The method of claim 1, further comprising:

performing an ion implantation process to form a floating diffusion node at a crossroad of the plurality of photodetectors;

forming a readout transistor on the second substrate, wherein the readout transistor comprises a gate electrode over a gate dielectric; and wherein the first plurality of conductive bond pads comprises a first conductive bond pad directly underlying the floating diffusion node, and wherein the first conductive bond pad directly electrically couples the floating diffusion node to the gate electrode of the readout transistor.

5. The method of claim 1, wherein the second bond structure comprises a single layer of conductive bond features disposed within a second bond dielectric structure, wherein the first plurality of shield structures are bonded to the second bond dielectric structure at the first bond interface.

6. The method of claim 2, wherein centers of shield structures in the first subset of the first plurality of shield structures are disposed along a circular path that is concentric with a center of the first conductive bond pad, wherein in top view the shield structures in the first subset of the first plurality of shield structures and the first conductive bond pad have a same shape.

7. The method of claim 1, wherein the first plurality of shield structures comprises a first shield structure and a second shield structure disposed on opposing sides of a first conductive bond pad in the first plurality of conductive bond pads, wherein a first distance between the first shield structure and the first conductive bond pad is greater than a width of the first shield structure and is less than a width of the first conductive bond pad.

8. The method of claim 7, wherein in a top view the first shield structure is elongated in a first direction and has a length greater than the width of the first conductive bond pad.

9. The method of claim 1, wherein forming the first bond structure comprises:

depositing the first bond dielectric structure on the first interconnect structure;

etching the first bond dielectric structure to form a plurality of openings in the first bond dielectric structure;

performing a deposition process to deposit one or more materials in the plurality of openings; and performing a planarization process on the one or more materials.

10. The method of claim 9, wherein the deposition process comprises performing a first deposition to deposit conductive bond pad material in a first subset of the plurality of openings and performing a second deposition to deposit a shield structure material in a second subset of the plurality of openings.

11. A method for forming an integrated circuit (IC), the method comprising:

forming a plurality of semiconductor devices on a first substrate;

forming a first interconnect structure on the first substrate;

depositing a first bond dielectric structure on the first interconnect structure;

etching the first bond dielectric structure to form a first plurality of openings and a second plurality of openings in the first bond dielectric structure;

depositing a first plurality of conductive bond structures in the first plurality of openings;

depositing a plurality of shield structures in the second plurality of openings, wherein in a top view the plurality of shield structures are disposed on at least four sides of an individual conductive bond structure in the first plurality of conductive bond structures, wherein in a cross-sectional view a first width of the individual conductive bond structure is greater than a second width of a first shield structure in the plurality of shield structures;

depositing a second bond dielectric structure on a second substrate;

forming a second plurality of conductive bond structures in the second bond dielectric structure; and bonding the first plurality of conductive bond structures to the second plurality of conductive bond structures.

12. The method of claim 11, wherein a third width of an individual conductive bond structure in the second plurality of conductive bond structures is less than the first width.

13. The method of claim 11, wherein bottom surfaces of the first plurality of conductive bond structures are aligned with bottom surfaces of the plurality of shield structures, and wherein top surfaces of the first plurality of conductive bond structures are aligned with top surfaces of the plurality of shield structures.

14. The method of claim 11, wherein the plurality of shield structures comprise a dielectric material and the first plurality of conductive bond structures comprise a metal material.

15. The method of claim 14, wherein a dielectric constant of the dielectric material is less than a dielectric constant of the first bond dielectric structure.

16. The method of claim 11, wherein the plurality of shield structures comprise a plurality of elongated shield structures and a plurality of shortened shield structures, wherein in the top view the plurality of elongated shield structures extend in a first direction and are arranged in parallel with one another, wherein the plurality of shortened shield structures continuously extend between adjacent elongated shield structures in the plurality of elongated shield structures.

17. A method for forming an integrated circuit (IC), the method comprising:

forming a first IC chip, comprising:

forming a first plurality of photodetectors of a first pixel sensor in a first substrate;

forming a second plurality of photodetectors of a second pixel sensor in the first substrate;

forming a first bond structure on the first substrate, wherein the first bond structure comprises a first plurality of conductive bond pads and a first plurality of shield structures in a first bond dielectric, wherein the first plurality of conductive bond pads comprises a first conductive bond pad electrically coupled to the first pixel sensor and a second conductive bond pad electrically coupled to the second pixel sensor, wherein the first plurality of shield structures comprises a first shield structure spaced directly between the first conductive bond pad and the second conductive bond pad;

forming a second IC chip, comprising:

forming a plurality of semiconductor devices on a first surface of a second substrate;

forming a second bond structure on the first surface of the second substrate, wherein the second bond structure comprises a plurality of conductive bond structures in a second bond dielectric; and performing a first bonding process to bond the first IC chip to the second IC chip such that a first bond interface is disposed between the first bond structure and the second bond structure.

18. The method of claim 17, wherein in top view the first plurality of shield structures are disposed on first opposing sides of the first conductive bond pad along a first direction and on second opposing sides of the first conductive bond pad along a second direction substantially orthogonal to the first direction.

19. The method of claim 17, further comprising:

etching a second surface of the second substrate to form a plurality of openings extending into the second substrate, wherein the second surface is vertically offset the first surface;

forming a plurality of through substrate vias (TSVs) in the plurality of openings;

forming a third bond structure on the plurality of TSVs, wherein the third bond structure comprises a second plurality of conductive bond pads and a second plurality of shield structures in a third bond dielectric, wherein the second plurality of shield structures are interposed between adjacent ones of the second plurality of conductive bond pads; and performing a second bonding process to bond the second IC chip to a third IC chip.

20. The method of claim 17, wherein the first plurality of shield structures directly contact a top surface of the second bond dielectric at the first bond interface.

* * * * *